(12) United States Patent
Eom

(10) Patent No.: US 12,432,913 B2
(45) Date of Patent: Sep. 30, 2025

(54) SEMICONDUCTOR MEMORY DEVICE

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 608 days.

(21) Appl. No.: 17/836,748

(22) Filed: Jun. 9, 2022

(65) Prior Publication Data

US 2023/0217651 A1 Jul. 6, 2023

(30) Foreign Application Priority Data

Jan. 3, 2022 (KR) .................. 10-2022-0000523

(51) Int. Cl.
| | |
|---|---|
| *H10B 41/27* | (2023.01) |
| *H01L 23/522* | (2006.01) |
| *H01L 23/528* | (2006.01) |
| *H10B 41/40* | (2023.01) |
| *H10B 43/27* | (2023.01) |
| *H10B 43/40* | (2023.01) |

(52) U.S. Cl.
CPC ......... *H10B 41/27* (2023.02); *H01L 23/5226* (2013.01); *H01L 23/5283* (2013.01); *H10B 41/40* (2023.02); *H10B 43/27* (2023.02); *H10B 43/40* (2023.02)

(58) Field of Classification Search
CPC ........ H10B 41/27; H10B 41/40; H10B 43/40; H10B 43/27
See application file for complete search history.

(56) References Cited

U.S. PATENT DOCUMENTS

2020/0273881 A1\* 8/2020 Kim .................... H01L 23/5226
2021/0313246 A1\* 10/2021 Matsumura ............ H10B 43/40
2021/0313281 A1\* 10/2021 Kaminaga .............. H10B 43/10

FOREIGN PATENT DOCUMENTS

KR 1020200089970 A 7/2020

\* cited by examiner

*Primary Examiner* — Mark W Tornow
(74) *Attorney, Agent, or Firm* — WILLIAM PARK AND ASSOCIATES LTD.

(57) ABSTRACT

A semiconductor memory device includes: a semiconductor substrate including a first region and a second region; a memory cell array over the first region of the semiconductor substrate; a dummy stack structure over the second region of the semiconductor substrate; a chip guard structure penetrating the dummy stack structure; and a void-containing structure penetrating the dummy stack structure.

17 Claims, 19 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2022-0000523 filed on Jan. 3, 2022, in the Korean Intellectual Property Office, the entire disclosure of which is incorporated by reference herein.

BACKGROUND

1. Technical Field

The present disclosure generally relates to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device includes a plurality of memory cells capable of storing data. In order to improve the degree of integration of the semiconductor memory device, a three-dimensional semiconductor memory device has been proposed, in which memory cells are three-dimensionally arranged above a substrate. The degree of integration of the three-dimensional semiconductor memory device may be improved by increasing a stacked number of memory cells.

SUMMARY

In accordance with an embodiment of the present disclosure, there is provided a semiconductor memory device including: a semiconductor substrate including a first region and a second region; a memory cell array over the first region of the semiconductor substrate; a dummy stack structure over the second region of the semiconductor substrate; a chip guard structure penetrating the dummy stack structure; and a void-containing structure penetrating the dummy stack structure.

In accordance with another embodiment of the present disclosure, there is provided a semiconductor memory device including: a semiconductor substrate including a memory cell array region, a scribe region, and a chip guard region between the memory cell array region and the scribe region; a gate stack structure including a plurality of interlayer insulating layers and a plurality of conductive patterns, which are alternately stacked over the semiconductor substrate in the memory cell array region; a channel structure penetrating the gate stack structure; a memory layer between the channel structure and the gate stack structure; a dummy stack structure including a plurality of first material layers and a plurality of second material layers, which are alternately stacked over the semiconductor substrate in the chip guard region and extend to overlap with the scribe region; a chip guard pattern penetrating a portion of the dummy stack structure overlapping with the chip guard region; and a void-containing pattern penetrating a portion of the dummy stack structure overlapping with the scribe region.

In accordance with still another embodiment of the present disclosure, there is provided a method of manufacturing a semiconductor memory device, the method including: providing a semiconductor substrate including a memory cell array region, a scribe region, and a chip guard region between the memory cell array region and the scribe region; forming a dummy stack structure overlapping with the scribe region and the chip guard region of the semiconductor substrate; forming a chip guard pattern penetrating a portion of the dummy stack structure overlapping with the chip guard region; forming a void-containing pattern while the chip guard pattern is formed, wherein the void-containing pattern penetrates a portion of the dummy stack structure overlapping with the scribe region; and cutting each of the dummy stack structure and the semiconductor substrate in units of chips along a void inside the void-containing pattern.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like reference numerals refer to like elements throughout.

DETAILED DESCRIPTION

Explanation of the present disclosure is merely an embodiment for structural or functional explanation, so the scope of the present teachings should not be construed to be limited to the embodiments explained in the embodiment. Therefore, various changes and modifications that fall within the scope of the claims, or equivalents of such scope are therefore intended to be embraced by the appended claims.

While terms such as "first" and "second" may be used to describe various components, such components should not be understood as being limited to the above terms. The above terms are used only to distinguish one component from another.

Various embodiments are directed to a semiconductor memory device and a manufacturing method of a semiconductor memory device, which may improve the stability of a manufacturing process.

Figure 1:
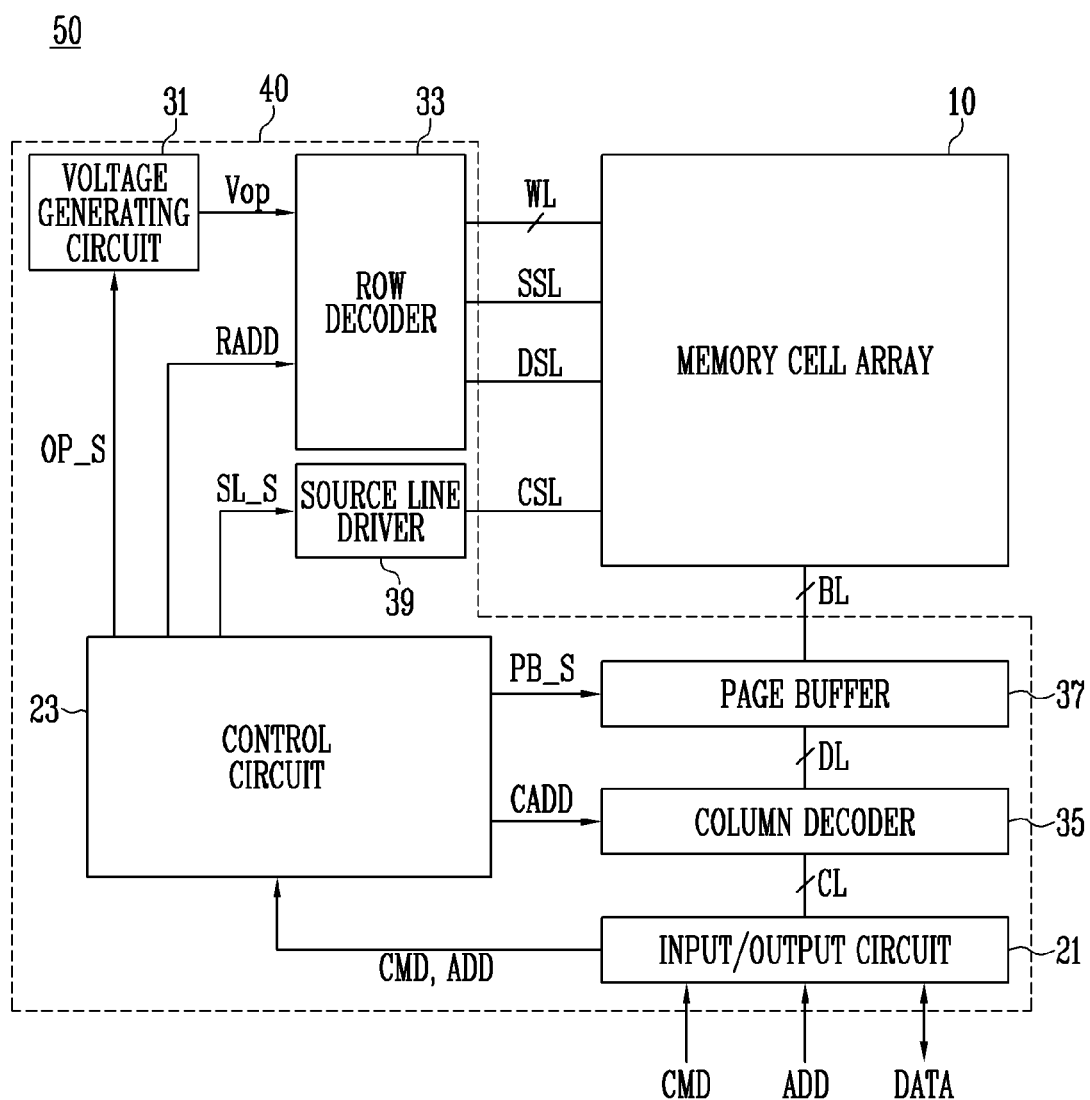
FIG. 1 is a block diagram illustrating a semiconductor memory device in accordance with an embodiment of the present disclosure.

FIG. 1 is a block diagram illustrating a semiconductor memory device 50 in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erase data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may be connected to a drain select line DSL, a plurality of word lines WL, a source select line SSL, a plurality of bit lines BL, and a common source line CSL.

The input/output circuit 21 may transfer, to the control circuit 23, a command CMD and an address ADD, which are transferred from an external device (e.g., a memory controller) of the semiconductor memory device 50. The input/output circuit 21 may exchange data DATA with the external device and the column decoder 35.

The control logic 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select line DSL, the word lines WL, and the source select line SSL in response to the row address RADD.

The column decoder 35 may transmit data DATA input from the input/output circuit 21 to the page buffer 37 or transmit data DATA stored in the page buffer 37 to the input/output circuit 21, in response to the column address CADD. The column decoder 35 may exchange data DATA with the input/output circuit 21 through column lines CL. The column decoder 35 may exchange data DATA with the page buffer 37 through data lines DL.

The page buffer 37 may temporarily store data DATA received through the bit lines BL in response to the page buffer control signal PB_S. The page buffer 37 may sense a voltage or current of the bit lines BL in a read operation.

The source line driver 39 may control a voltage applied to the common source line CSL in response to the source line control signal SL_S.

Figure 2:
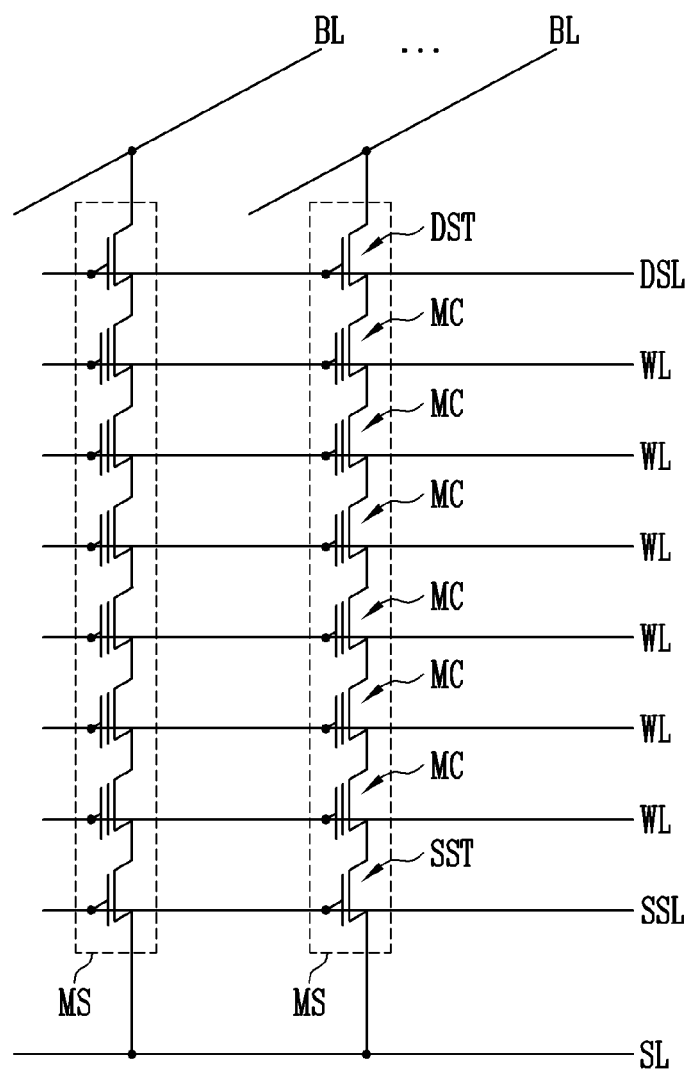
FIG. 2 is a circuit diagram illustrating a memory cell array in accordance with an embodiment of the present disclosure.

FIG. 2 is a circuit diagram illustrating a memory cell array in accordance with an embodiment of the present disclosure.

Referring to FIG. 2, the memory cell array may include a source layer SL, a plurality of bit lines BL, and a plurality of memory cell strings MS. Each memory cell string MS may be connected to a bit line BL corresponding thereto, and be connected to the source layer SL.

The memory cell string MS may include a plurality of memory cells MC connected in series, at least one source select transistor SST, and at least one drain select transistor DST. In an embodiment, the memory cell string MS may include one source select transistor SST connected between the plurality of memory cells MC and the source layer SL. In another embodiment, the memory cells string MS may include two or more source select transistors SST connected in series between the plurality of memory cells MC and the source layer SL. In an embodiment, the memory cell string MS may include one drain select transistor DST connected between the plurality of memory cells MC and the bit line BL. In another embodiment, the memory cell string MS may include two or more drain select transistors DST connected in series between the plurality of memory cells MC and the bit line BL.

The plurality of memory cells MC may be connected to the source layer SL via the source select transistor SST. The plurality of memory cells MC may be connected to the bit line BL via the drain select transistor DST.

A plurality of source select transistors SST disposed at the same level may be commonly connected to a source select line SSL. The source select line SSL may transmit a gate signal to each of the plurality of source select transistors SST. A plurality of drain select transistors DST disposed at the same level may be commonly connected to a drain select line DSL. The drain select line DSL may transmit a gate signal to each of the plurality of drain select transistors DST. A plurality of word lines WL between the source select line SSL and the drain select line DSL may be disposed at different levels. Each word line WL may be commonly connected to the plurality of memory cell strings MS. Each word line WL may transmit a gate signal to a memory cells MC corresponding thereto.

The plurality of memory cell strings MS connected to the same drain select line DSL may be respectively connected to different bit lines BL. The source layer SL may form the common source line CSL shown in FIG. 1 or may be connected to the common source line CSL.

Figure 3A:
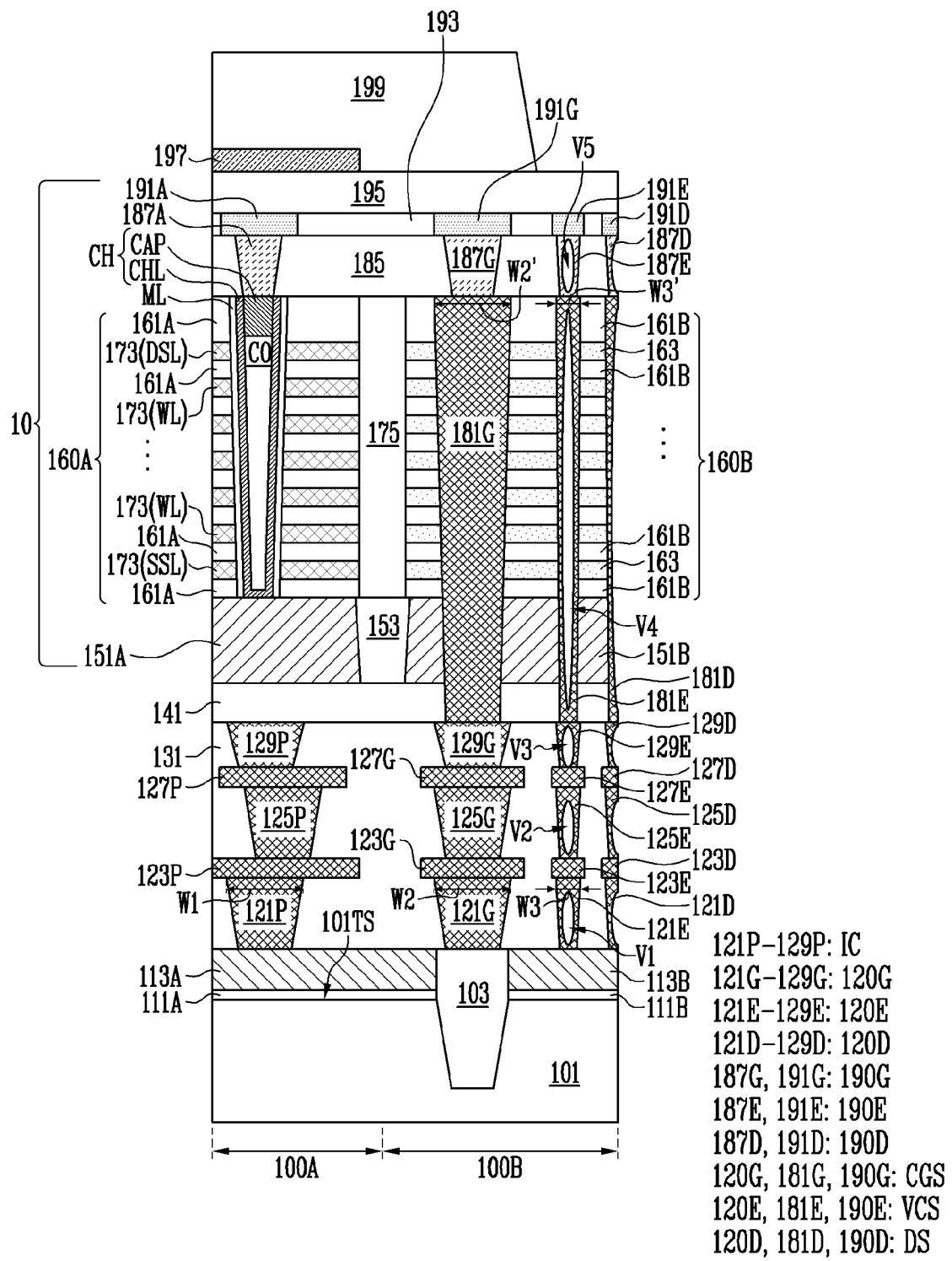
FIGS. 3A and 3B are sectional views illustrating semiconductor memory devices in accordance with embodiments of the present disclosure.
Figure 3B:
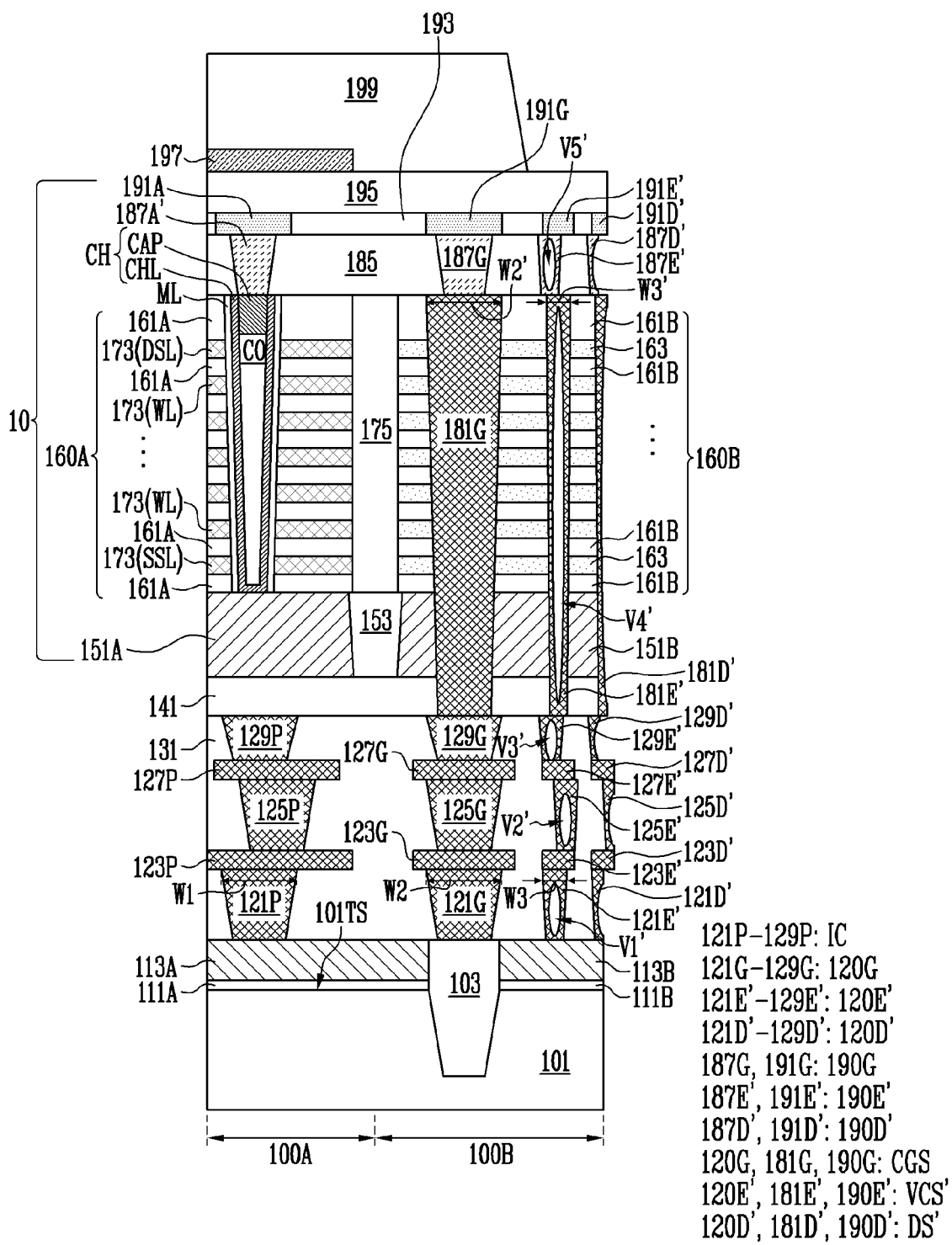

FIGS. 3A and 3B are sectional views illustrating semiconductor memory devices in accordance with embodiments of the present disclosure.

Referring to FIGS. 3A and 3B, each semiconductor memory device may include a semiconductor substrate 101 including a first region 100A and a second region 100B, a chip guard structure CGS over the second region 100B of the semiconductor substrate 101, and a void-containing structure VCS or VCS' over the second region 100B of the semiconductor substrate 101. The void-containing structure VCS or VCS' may be spaced apart from a memory cell array 10 with the chip guard structure CGS interposed therebetween.

The semiconductor substrate 101 may be a semiconductor substrate including a silicon substrate, a germanium substrate, and the like. The semiconductor substrate 101 may include a top surface 101TS facing the memory cell array 10. An isolation structure 103 formed of an insulating material may be buried inside the semiconductor substrate 101.

The semiconductor memory device may include a dummy structure DS or DS' over the second region 100B of the semiconductor substrate 101. The dummy structure DS or DS' may be spaced apart from the memory cell array 10 with the chip guard structure CGS and the void-containing structure VCS or VCS' interposed therebetween. The dummy structure DS or DS' may be disposed along an edge of the semiconductor substrate 101. In an embodiment, a plurality of dotted patterns may be disposed to be spaced apart from each other along the edge of the semiconductor substrate 101. The plurality of dotted patterns may be disposed along a region surrounding the chip guard structure CGS on a plane substantially parallel to the top surface 101TS of the semiconductor substrate 101. The void-containing structure VCS or VCS' may form each of the plurality of dotted patterns. In another embodiment, a closed shape pattern may be disposed along the edge of the semiconductor substrate 101. The closed shape pattern may continuously extend along a region surrounding the chip guard structure on a plane substantially parallel to the top surface 101TS of the semiconductor substrate 101. The void-containing structure VCS or VCS' may form the closed shape pattern. The plurality of dotted patterns will be described later with reference to reference numeral "DP" shown in FIG. 8A, and the closed shape pattern will be described later with reference to reference numerals "CP" shown in FIG. 8B.

The semiconductor memory device may include a peripheral circuit structure and an interconnection IC. The peripheral circuit structure may be disposed between the semiconductor substrate 101 and the memory cell array 10. The interconnection IC may be connected to the peripheral circuit structure. A gate electrode 113A and a gate insulating layer 111A, which are shown in FIGS. 3A and 3B, may be included in the peripheral circuit structure. In an embodiment, the peripheral circuit structure may include a transistor, and the gate electrode 113A and the gate insulating layer 111A may be included in the transistor.

The gate insulating layer 111A and the gate electrode 113A may be stacked over the first region 100A of the semiconductor substrate 101. A dummy gate insulating layer 111B and a dummy gate electrode 113B may be stacked over the second region 100B of the semiconductor substrate 101. The dummy gate electrode 113B may be formed of the same conductive material as the gate electrode 113A.

The isolation structure 103 may extend between the gate insulating layer 111A and the dummy gate insulating layer 111B. The isolation structure 103 may extend between the gate electrode 113A and the dummy gate electrode 113B.

The semiconductor substrate 101, the gate electrode 113A, and the dummy gate electrode 113B may be covered by a first lower insulating structure 131. The first lower insulating structure 131 may include two or more insulating layers.

The interconnection IC may be buried inside the first lower insulating structure 131. The interconnection IC may include a plurality of conductive patterns 121P, 123P, 125P, 127P, and 129P stacked in a vertical direction substantially orthogonal to the top surface 101TS of the semiconductor substrate 101. Although the interconnection IC connected to the gate electrode 113A of the transistor is exemplified in FIGS. 3A and 3B, the embodiment of the present disclosure is not limited thereto. For example, the interconnection IC may be connected to a source region or a drain region of the transistor.

The interconnection IC and the first lower insulating structure 131 may be covered by a second lower insulating structure 141.

The memory cell array 10 may include a source layer 151A over the second lower insulating structure 141, a gate stack structure 160A over the source layer 151A, a channel structure CH penetrating the gate stack structure 160A, a memory layer ML between the channel structure CH and the gate stack structure 160A, and a bit line 191A connected to the channel structure CH.

The source layer 151A may be formed as a doped semiconductor layer or be formed as a stack structure of a metal layer and a doped semiconductor layer. The doped semiconductor layer may include at least one of a p-type impurity and an n-type impurity.

The gate stack structure 160A may include a plurality of interlayer insulating layers 161A and a plurality of conductive patterns 173, which are alternately stacked over the source layer 161A. The plurality of conductive patterns 173 may be insulated from each other by the plurality of interlayer insulating layers 161A. At least one of the plurality of conductive patterns 173 may be used as a source select line SSL, and at least another of the plurality of conductive patterns 173 may be used as a drain select line DSL. Conductive patterns between the source select line SSL and the drain select line DSL among the plurality of conductive patterns 173 may be used as word lines WL.

The memory layer ML may include a tunnel insulating layer between the channel structure CH and the gate stack structure 160A, a data storage layer between the tunnel insulating layer and the gate stack structure 160A, and a blocking insulating layer between the data storage layer and the gate stack structure 160A. The memory layer ML may be interposed between each conductive pattern 173 and the channel structure CH. In an embodiment, the memory layer ML may extend between each interlayer insulating layer 161A and the channel structure CH. However, the embodiment of the present disclosure is not limited thereto. Although not shown in the drawings, the plurality of interlayer insulating layers 161A may include protrusion parts further protruding toward the channel structure CH than the plurality of conductive patterns 173, and the memory layer ML may be disposed between protrusions of interlayer insulating layers adjacent to each other in the vertical direction. The memory layer ML may be isolated into a plurality of memory patterns by the protrusion parts of the interlayer insulating layers. The data storage layer may be formed as a material layer capable of storing data. In an embodiment, the data storage layer may be formed of a material layer capable of storing data changed using Fowler-Nordheim tunneling. The material layer may include a nitride layer in which charges can be trapped. However, the embodiment of the present disclosure is not limited thereto, and the data storage layer may include a material layer including a nano dot, a variable resistance material layer, a floating gate, and the like.

The channel structure CH may include a channel layer CHL and a capping pattern CAP. The channel layer CHL may be formed of a semiconductor material including silicon, germanium, and the like. The capping pattern CAP may be formed as a doped semiconductor layer. In an embodiment, the capping pattern CAP may include an n-type doped silicon layer. The channel layer CHL may be in contact with the source layer 151A, and extend in the vertical direction. The channel layer CHL may be formed in a tubular shape. The capping pattern CAP may be disposed inside a central region of the tubular channel layer CHL. A core insulating layer CO may be further disposed inside the central region of the tubular channel layer CHL. The core insulating layer CO may be disposed under the capping pattern CAP. The channel layer CHL may extend along a sidewall of the core insulating layer CO and a sidewall of the capping pattern CAP.

The bit line 191A may be in direct contact with the channel structure CH or be electrically connected to the channel structure CH via a contact structure 187A. The contact structure 187A may penetrate a first insulating layer 185, and be formed of a conductive material. The first insulating layer 185 may be interposed between the bit line 191A and the gate stack structure 160A. The bit line 191A may penetrate a second insulating layer 193, and be formed of a conductive material. The second insulating layer 193 may be disposed above the first insulating layer 185.

The semiconductor memory device may further include an upper insulating layer 195 over the first insulating layer 185, an upper line 197 over the upper insulating layer 195, and a protective layer 199 covering the upper line 197.

The chip guard structure CGS may include at least one of a lower chip guard structure 120G, an intermediate chip guard pattern 181G, and an upper chip guard structure 190G. The void-containing structure VCS or VCS' may include at least one of a lower void-containing structure 120E or 120E', an intermediate void-containing pattern 181E or 181E', and an upper void-containing structure 190E or 190E'. The dummy structure DS or DS' may include at least one of a lower dummy structure 120D or 120D', an intermediate dummy pattern 181D or 181D', and an upper dummy structure 190D or 190D'. The void-containing structure VCS or VCS' may be formed to have a width narrower than a width of the chip guard structure CGS. The dummy structure DS or DS' may be formed to have a width narrower than the width of the void-contain structure VCS or VCS'.

Each of the lower chip guard structure 120G, the lower void-containing structure 120E or 120E, and the lower dummy structure 120D or 120D' may be disposed at the substantially same level. In an embodiment, each of the lower chip guard structure 120G, the lower void-containing structure 120E or 120E, and the lower dummy structure 120D or 120D' may be buried inside the first lower insulating structure 131.

The lower chip guard structure 120G may include a plurality of lower chip guard patterns 121G, 123G, 125G, 127G, and 129G formed as the same conductive layers as the conductive patterns 121P, 123P, 125P, 127P, and 129P of the interconnection IC. The lower chip guard patterns 121G, 123G, 125G, 127G, and 129G may be stacked in the vertical direction on the isolation structure 103.

As shown in FIG. 3A, the lower void-containing structure 120E may include a plurality of edge patterns 121E, 123E, 125E, 127E, and 129E shown in FIG. 3A, which are formed as the same conductive layers as the conductive patterns 121P, 123P, 125P, 127P and 129P. As shown in FIG. 3B, the lower void-containing structure 120E' may include a plurality of edge patterns 121E', 123E', 125E', 127E' and 129E', which are formed as the same conductive layers as the conductive patterns 121P, 123P, 125P, 127P and 129P. The plurality of edge patterns 121E, 123E, 125E, 127E, and 129E shown in FIG. 3A or 121E', 123E', 125E', 127E' and 129E' shown in FIG. 3B may be stacked in the vertical direction, and include at least one lower void-containing pattern. In an embodiment, as shown in FIG. 3A, the plurality of edge patterns 121E, 123E, 125E, 127E and 129E may include a plurality of lower void-containing patterns 121E, 125E and 129E, which are disposed to be spaced apart from each other in the vertical direction, and at least one pad pattern 123G and 127G, which are alternately disposed therewith in the vertical direction. As shown in FIG. 3B, the plurality of edge patterns 121E', 123E', 125E', 127E' and 129E' may include a plurality of lower void-containing patterns 121E', 125E' and 129E', which are disposed to be spaced apart from each other in the vertical direction, and at least one pad pattern 123G' and 127G', which are alternately disposed therewith in the vertical direction.

An aspect ratio of each of the plurality of lower void-containing patterns 121E, 125E, and 129E shown in FIG. 3A may be greater than an aspect ratio of each of the pad patterns 123G and 127G shown in FIG. 3A. An aspect ratio of each of the plurality of lower void-containing patterns 121E', 125E', and 129E' shown in FIG. 3B may be greater than an aspect ratio of each of the pad patterns 123G' and 127G' shown in FIG. 3B. A plurality of voids V1, V2, and V3 shown in FIG. 3A may be respectively disposed inside the plurality of lower void-containing patterns 121E, 125E, and 129E shown in FIG. 3A. A plurality of voids V1', V2', and V3' shown in FIG. 3B may be respectively disposed inside the plurality of lower void-containing patterns 121E', 125E', and 129E' shown in FIG. 3B or 121E', 125E', and 129E' shown in FIG. 3B. The aspect ratio of each of the plurality of lower void-containing patterns 121E, 125E, and 129E shown in FIG. 3A or 121E', 125E', and 129E' shown in FIG. 3B may be controlled to become greater than an aspect ratio of each of a plurality of conductive patterns 121P. 125P, and 129P and a plurality of lower chip guard patterns 121G, 125G, and 129G, which are disposed at the same levels there as. Accordingly, while the plurality of conductive patterns 121P, 125P, and 129P and the plurality of lower chip guard patterns 121G, 125G, and 129G are formed by using a damascene process, it may be induced that the plurality of voids V1, V2, and V3 shown in FIG. 3A or V1', V2', and V3' shown in FIG. 3B are respectively formed inside the plurality of lower void-containing patterns 121E, 125E, and 129E shown in FIG. 3A or 121E', 125E', and 129E' shown in FIG. 3B. The plurality of lower void-containing patterns 121E, 125E, and 129E shown in FIG. 3A are formed to have a width narrow than widths of the plurality of conductive patterns 121P, 125P, and 129P and the plurality of lower chip guard patterns 121G, 125G, and 129G, so that the aspect ratio of each of the plurality of lower void-containing patterns 121E, 125E, and 129E shown in FIG. 3A may be controlled to become relatively large. The plurality of lower void-containing patterns 121E', 125E', and 129E' are formed to have a width narrow than widths of the plurality of conductive patterns 121P, 125P, and 129P and the plurality of lower chip guard patterns 121G, 125G, and 129G, so that the aspect ratio of each of the plurality of lower void-containing patterns 121E', 125E', and 129E' may be controlled to become relatively large. For example, a width W3 of the lower void-containing pattern 121E or 121E' may be controlled to become a width W1 of the conductive pattern 121P and a width W2 of the lower chip guard pattern 121G.

The lower dummy structure 120D or 120D' may include a plurality of lower dummy patterns 121D, 123D, 125D, 127D, and 129D shown in FIG. 3A or 121D', 123D', 125D', 127D', and 129D' shown in FIG. 3B, which are formed as the same conductive layers as the conductive patterns 121P, 123P, 125P, 127P, and 129P of the interconnection IC. The plurality of lower dummy patterns 121D, 123D, 125D, 127D, and 129D shown in FIG. 3A or 121D', 123D', 125D', 127D', and 129D' shown in FIG. 3B may be stacked in the vertical direction.

The intermediate chip guard pattern 181G may overlap with the lower chip guard structure 120G, the intermediate void-containing pattern 181E or 181E' may overlap with the lower void-containing structure 120E or 120E', and the intermediate dummy pattern 181D or 181D' may overlap with the lower dummy structure 120D or 120D'. Each of the intermediate chip guard pattern 181G, the intermediate void-containing pattern 181E or 181E', and the intermediate dummy pattern 181D or 181D' may penetrate a dummy stack structure 160B.

The dummy stack structure 160B may overlap with the second region 100B of the semiconductor substrate 101. The dummy stack structure 160B may include a plurality of first material layers 161B and a plurality of second material layers 163, which are alternately stacked over the second lower insulating structure 141. The plurality of first material layers 161B may be respectively disposed at the substantially same levels as the plurality of interlayer insulating layers 161A. The plurality of first material layers 161B may be formed of the same insulating material as the plurality of interlayer insulating layers 161A. The plurality of second material layers 163 may be respectively disposed at the substantially same levels as the plurality of conductive patterns 173. The plurality of second material layers 163 may be formed of a material different from the material of the plurality of first material layers 161B. In an embodiment, each of the plurality of first material layers 161B may include oxide, and each of the plurality of second material layers 163 may include nitride. However, the embodiment of the present disclosure is not limited thereto. For example, each of the plurality of first material layers 161B may include oxide, and each of the plurality of second material layers 163 may include at least one of silicon and metal.

The semiconductor memory device may further include a dummy source layer 151B. The dummy source layer 151B may be disposed between the dummy stack structure 160B and the second lower insulating structure 141. The dummy source layer 151B may be disposed at the substantially same level as the source layer 151A. The dummy source layer 151B may be penetrated by the intermediate chip guard pattern 181G, the intermediate void-containing pattern 181E or 181E', and the intermediate dummy pattern 181D or 181D'.

A first isolation insulating layer 153 may be disposed between the dummy source layer 151B and the source layer 151A. A second isolation insulating layer 175 may be disposed between the dummy stack structure 160B and the gate stack structure 160A. The second isolation insulating layer 175 may overlap with the first isolation insulating layer 153.

Each of the intermediate chip guard pattern 181G, the intermediate void-containing pattern 181E or 181E', and the intermediate dummy pattern 181D or 181D' may extend substantially in parallel to the channel structure CH. The intermediate chip guard pattern 181G may be connected to the lower chip guard structure 120G while penetrating the dummy source layer 151B. The intermediate void-containing pattern 181E or 181E' may be connected to the lower void-containing structure 120E or 120E' while penetrating the dummy source layer 151B. The intermediate dummy pattern 181D or 181D' may be connected to the lower dummy structure 120D or 120D' while penetrating the dummy source layer 151B.

A void V4 or V4' may be disposed inside the intermediate void-containing pattern 181E or 181E'. An aspect ratio of the intermediate void-containing pattern 181E or 181E' may be controlled to become greater than an aspect ratio of the intermediate chip guard pattern 181G. Accordingly, while the intermediate chip guard pattern 181G is formed by using a damascene process, it may be induced that a plurality of voids V4 or V4' are formed inside the intermediate void-containing pattern 181E or 181E'. A width W3' of the intermediate void-containing pattern 181E or 181E' is formed narrower than a width W2' of the intermediate chip guard pattern 181G, so that the aspect ratio of the intermediate void-containing pattern 181E or 181E' may be controlled to become relatively large.

Each of the first insulating layer 185 and the second insulating layer 193 may extend to overlap with the dummy stack structure 160B. The upper chip guard structure 190G may overlap with the intermediate chip guard pattern 181G, the upper void-containing structure 190E or 190E' may overlap with the intermediate void-containing pattern 181E or 181E', and the upper dummy structure 190D or 190D' may overlap with the intermediate dummy pattern 181D. The upper chip guard structure 190G, the upper void-containing structure 190E or 190E', and the upper dummy structure 190D or 190D' may penetrate the first insulating layer 185 and the second insulating layer 193.

The upper chip guard structure 190G may include upper chip guard patterns stacked in the vertical direction. In an embodiment, the upper chip guard structure 190G may include a first upper chip guard pattern 187G and a second upper chip guard pattern 191G. The first upper chip guard pattern 187G may be formed as the same conductive layer as the contact structure 187A, and the second upper chip guard pattern 191G may be formed as the same conductive layer as the bit line 191A. The first upper chip guard pattern 187G may penetrate the first insulating layer 185, and be connected to the intermediate chip guard pattern 181G. The second upper chip guard pattern 191G may penetrate the second insulating layer 193, and be connected to the first upper chip guard pattern 187G.

The upper void-containing structure 190E or 190E' may include edge patterns stacked in the vertical direction. In an embodiment, the upper void-containing structure 190E or 190E' may include an upper void-containing pattern 187E or 187E' and an upper pad pattern 191E or 191E'. The upper void-containing pattern 187E or 187E' may be formed as the same conductive layer as the contact structure 187A, and the upper pad pattern 191E or 191E' may be formed as the same conductive layer as the bit line 191A. The upper void-containing pattern 187E or 187E' may be disposed at the substantially same level as the contact structure 187A. The upper void-containing pattern 187E or 187E' may penetrate the first insulating layer 185 overlapping with the intermediate void-containing pattern 181E or 181E'. The upper void-containing pattern 187E or 187E' may be connected to the intermediate void-containing pattern 181E or 181E'. The upper pad pattern 191E or 191E' may be disposed at the substantially same level as the bit line 191A. The upper pad pattern 191E or 191E' may penetrate the second insulating layer 193, and be connected to the upper void-containing pattern 187E or 187E'. Because the upper void-containing pattern 187E or 187E' is formed to have a width narrower than a width of each of the upper pad pattern 191E or 191E', the contact structure 187A, and the first upper chip guard pattern 187G, the upper void-containing pattern 187E or 187E' may have a relatively large aspect ratio. Accordingly, while the contact structure 187A and the first upper chip guard pattern 187G are formed by using a damascene process, it may be induced that a plurality of voids V5 or V5' are formed inside the upper void-containing pattern 187E or 187E'.

The upper dummy structure 190D or 190D' may include upper dummy patterns stacked in the vertical direction. In an embodiment, the upper dummy structure 190D or 190D' may include a first upper dummy pattern 187D and a second upper dummy pattern 191D. The first upper dummy pattern 187D may be formed as the same conductive layer as the contact structure 187A, and the second upper dummy pattern 191D may be formed as the same conductive layer as the bit line 191A. The first upper dummy pattern 187D may penetrate the first insulating layer 185, and the second upper dummy pattern 191D may penetrate the second insulating layer 193.

The upper insulating layer 195 may extend to cover the upper chip guard structure 190G, the upper void-containing structure 190E or 190E', and the upper dummy structure 190D or 190D'. The protective layer 199 might not overlap with the void-containing structure VCS or VCS' and the dummy structure DS or DS'.

Referring to FIG. 3A, the plurality of lower void-containing patterns 121E, 125E, and 129E, the intermediate void-containing pattern 181E, and the upper void-containing pattern 187E may be aligned in a line in the vertical direction. Corresponding to this, the plurality of voids V1, V2, V3, V4, and V5 may be aligned in a line in the vertical direction. The plurality of lower dummy patterns 121D, 123D, 125D, 127D, and 129D, the intermediate dummy pattern 181D, the first upper dummy pattern 187D, and the second upper dummy pattern 191D may be aligned in a line in the vertical direction.

Referring to FIG. 3B, the plurality of lower void-containing patterns 121E', 125E', and 129E', the intermediate void-containing pattern 181E', and the upper void-containing pattern 187E' may be arranged in zigzag in the vertical direction. Corresponding to this, the plurality of voids V1', V2', V3', V4', and V5' may be arranged in zigzag in the vertical direction. The plurality of lower dummy patterns 121D', 123D', 125D', 127D', and 129D', the intermediate dummy pattern 181D', the first upper dummy pattern 187D', and the second upper dummy pattern 191D' may be arranged in zigzag in the vertical direction.

The memory cell array 10 is not limited to the embodiments shown in FIGS. 3A and 3B, and may be variously modified.

Figure 4A:
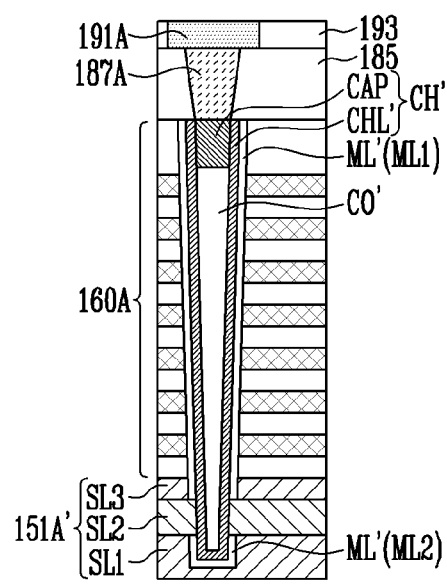
FIGS. 4A and 4B are sectional views illustrating embodiments of a memory cell array of a semiconductor memory device.
Figure 4B:
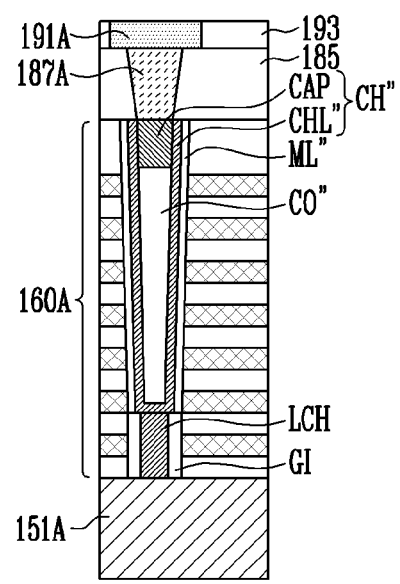

FIGS. 4A and 4B are sectional views illustrating embodiments of the memory cell array of the semiconductor memory device.

Referring to FIGS. 4A and 4B, each memory cell array may include a source layer 151A' or 151A, a gate stack structure 160A, a channel structure CH' or CH", a memory layer ML' or ML", and a bit line 191A.

As shown in FIG. 4A, a source layer 151A' in accordance with an embodiment of the present disclosure may include a first source layer SL1 and a second source layer SL2 over the first source layer SL1. The first source layer SL1 may be formed as a doped semiconductor layer or be formed as a stack structure of a metal layer and a doped semiconductor layer. The second source layer SL2 may be formed as a doped semiconductor layer. The source layer 151A' may further include a third source layer SL3 over the second source layer SL2. The third source layer SL3 may be formed as a doped semiconductor layer. The doped semiconductor layer forming each of the first source layer SL1, the second source layer SL2, and the third source layer SL3 may include at least one of a p-type impurity and an n-type impurity.

As shown in FIG. 4B, a source layer 151A in accordance with an embodiment of the present disclosure may be formed as a doped semiconductor layer as described with reference to FIGS. 3A and 3B, or be formed as a stack structure of a metal layer and a doped semiconductor layer.

Referring to FIGS. 4A and 4B, the gate stack structure 160A may be disposed above the source layer 151A' or 151A. The gate stack structure 160A may be configured identically as described with reference to FIGS. 3A and 3B.

Referring to FIGS. 4A and 4B, the memory layer ML' or ML" may include a tunnel insulating layer, a data storage layer, and a blocking insulating layer as described with reference to FIGS. 3A and 3B. The channel structure CH' or CH" may include a channel layer CHL' or CHL" and a capping pattern CAP as described with reference to FIGS. 3A and 3B. The channel structure CH' or CH" may further include a core insulating layer CO' or CO" as described with reference to FIGS. 3A and 3B.

Referring to FIG. 4A, a channel layer CHL' and a core insulating layer CO' of a channel structure CH' may penetrate the gate stack structure 160A, the third source layer SL3, and the second source layer SL2, and extend to the inside of the first source layer SL1. A memory layer ML' in accordance with an embodiment of the present disclosure may be isolated into a first memory pattern ML1 and a second memory pattern ML2. The first memory pattern ML1 may be disposed between the gate stack structure 160A and the channel layer CHL', and the second memory pattern ML2 may be disposed between the first source layer SL1 and the channel layer CHL'. The second source layer SL2 may be interposed between the first memory pattern ML1 and the second memory pattern ML2, and be in contact with a sidewall of the channel layer CHL'. Accordingly, the source layer 151A' may be electrically connected to the channel structure CH' through the second source layer SL2.

Referring to FIG. 4B, a channel layer CHL" and a core insulating layer CO" of a channel structure CH" may be disposed above a lower channel structure LCH. The lower channel structure LCH may penetrate a lower portion of the gate stack structure 160A, which is adjacent to the source layer 151A. The lower channel structure LCH may be formed as a semiconductor layer. A sidewall of the lower channel structure LCH may be surrounded by a gate insulating layer GI. The lower channel structure LCH may be in contact with the source layer 151A. The channel layer CHL" may be in contact with the lower channel structure LCH. The channel layer CHL" may be electrically connected to the source layer 151A via the lower channel structure LCH. The channel layer CHL", the memory layer ML", and the core insulating layer CO" may penetrate a portion of the gate stack structure 160A disposed at a level upper than a level of the lower channel structure LCH.

Referring to FIGS. 4A and 4B, a first insulating layer 185 and a second insulating layer 193 may be stacked over the gate stack structure 160A. As described with reference to FIGS. 3A and 3B, the bit line 191A may be buried inside the second insulating layer 193, and be electrically connected to the channel structure CH' or CH" via a contact structure 187A. The contact structure 187A may penetrate the first insulating layer 185 as described with reference to FIGS. 3A and 3B.

Hereinafter, a manufacturing method of a semiconductor memory device in accordance with an embodiment of the present disclosure will be described based on a manufacturing method of the semiconductor memory device shown in FIGS. 3A and 3B. Hereinafter, descriptions of portions identical to those shown in FIGS. 3A and 3B will be omitted.

Figure 5:
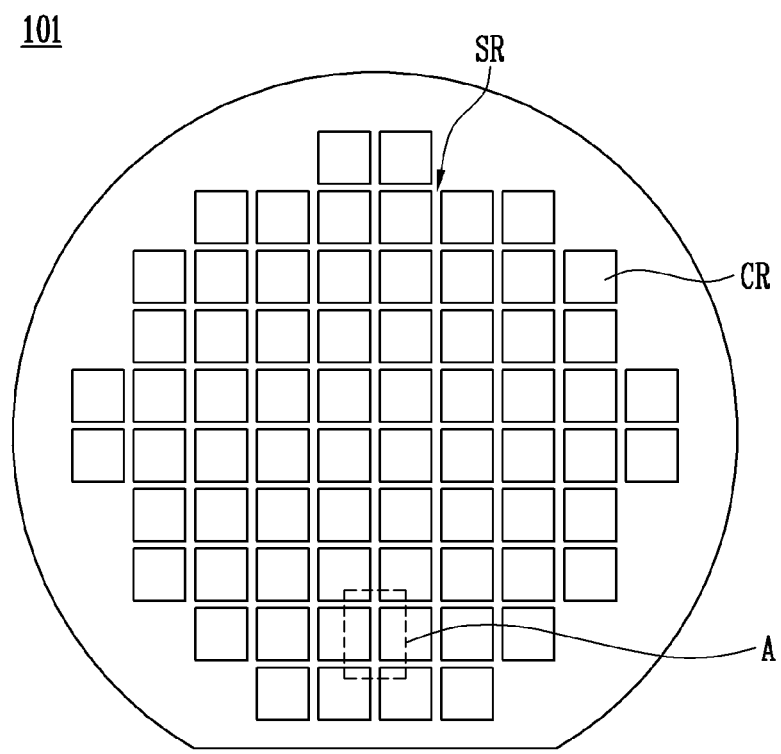
FIGS. 5 and 6 are plan views illustrating a semiconductor substrate.
Figure 6:
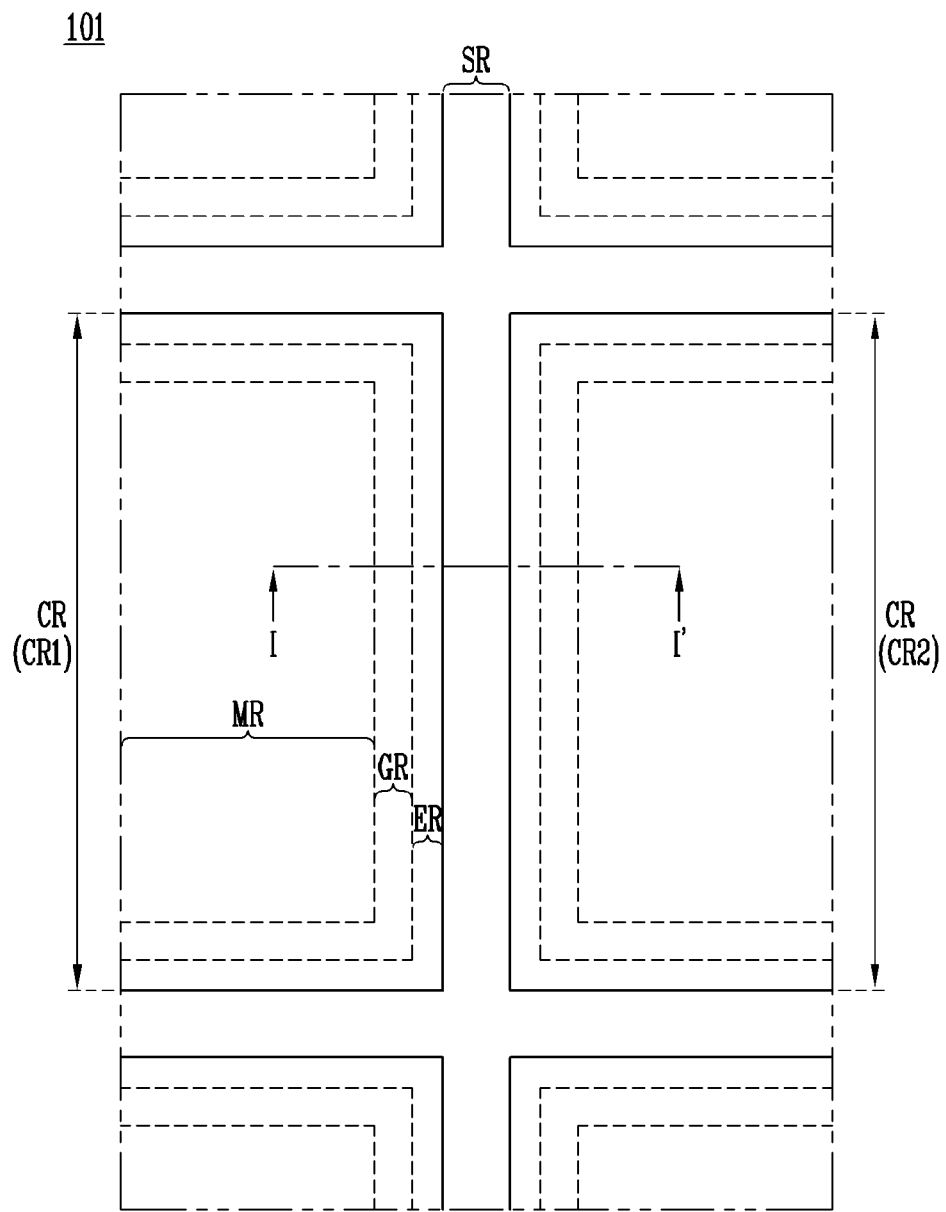

FIGS. 5 and 6 are plan views illustrating a semiconductor substrate. FIG. 5 illustrates a semiconductor substrate 101 including a scribe region SR, and FIG. 6 illustrates enlarged region A shown in FIG. 5.

Referring to FIGS. 5 and 6, the semiconductor substrate 101 may include a plurality of chip regions CR and the scribe region SR. The plurality of chip regions CR may be partitioned by the scribe region SR, and the scribe region SR may surround each chip region CR.

Each chip region CR may include a memory cell array region MR, a chip guard region GR, and an edge region ER. The chip guard region GR and the edge region ER may be disposed between the memory cell array region MR and the scribe region SR. The edge region ER may be defined as a region disposed along an edge of the chip region CR. The chip guard region GR may be defined as a region between the edge region ER and the memory cell array region MR, and surround the memory cell array region MR.

In a process of manufacturing the semiconductor memory device, a void-containing structure identical to the void-containing structure VCS shown in FIG. 3A or the void-containing structure VCS' shown in FIG. 3B may be formed in each of the edge region ER and the scribe region SR. In a process of cutting the semiconductor substrate 101 in units of chips along the scribe region SR, a crack may propagate to the inside of the semiconductor substrate 101 due to a void of the void-containing structure formed in the scribe region SR. Line I-I' shown in FIG. 6 traverses a first chip region CR1 and a second chip region CR2, which are adjacent to each other, among the plurality of chip regions CR and the scribe region SR therebetween. Hereinafter, a manufacturing method of a semiconductor memory device will be described based on process sectional views taken along the line I-I'.

Hereinafter, FIGS. 7A, 9, 10A, 11A, and 12A are sectional views illustrating a manufacturing method of a semiconductor memory device in accordance with an embodiment of the present disclosure. FIGS. 7B, 10B, 11B, and 12B are sectional views illustrating a manufacturing method of a semiconductor memory device in accordance with an embodiment of the present disclosure. For example, the semiconductor memory device shown in FIG. 3A may be provided by using the manufacturing method shown in FIGS. 7A, 9, 10A, 11A, and 12A, and the semiconductor memory device shown in FIG. 3B may be provided by using the manufacturing method shown in FIGS. 7B, 10B, 11B, and 12B.

Figure 7A:
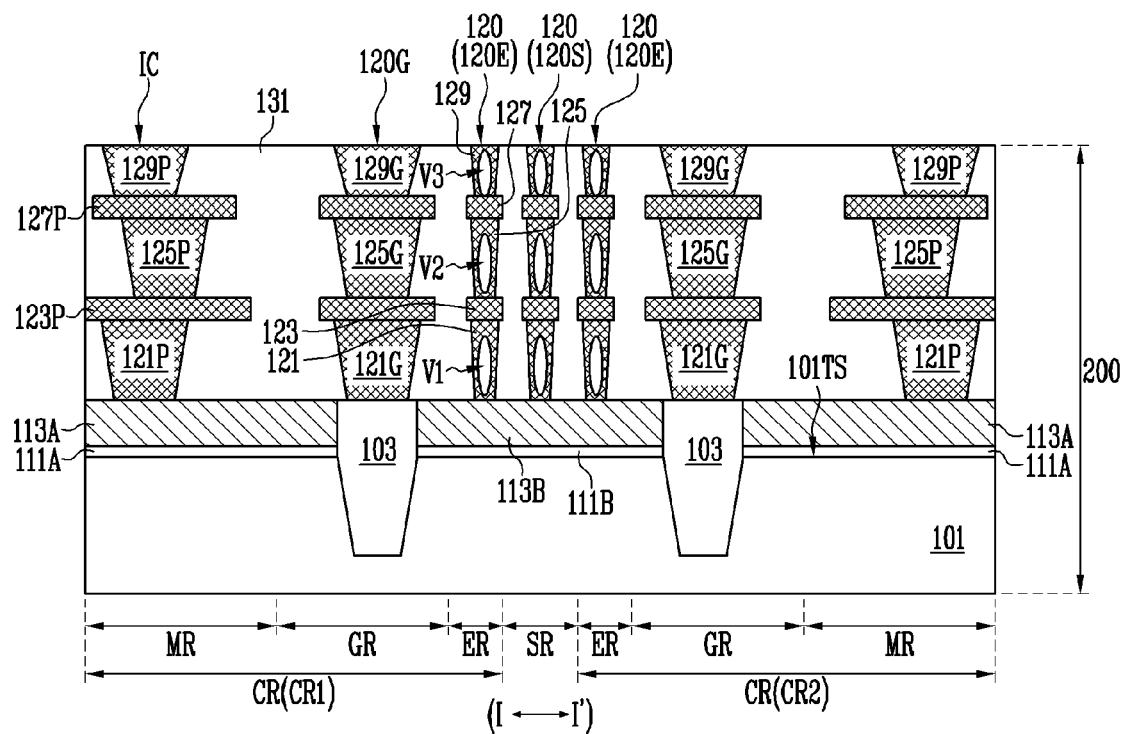
FIGS. 7A, 9, 10A, 11A, and 12A are sectional views illustrating a manufacturing method of a semiconductor memory device in accordance with an embodiment of the present disclosure.
Figure 7B:
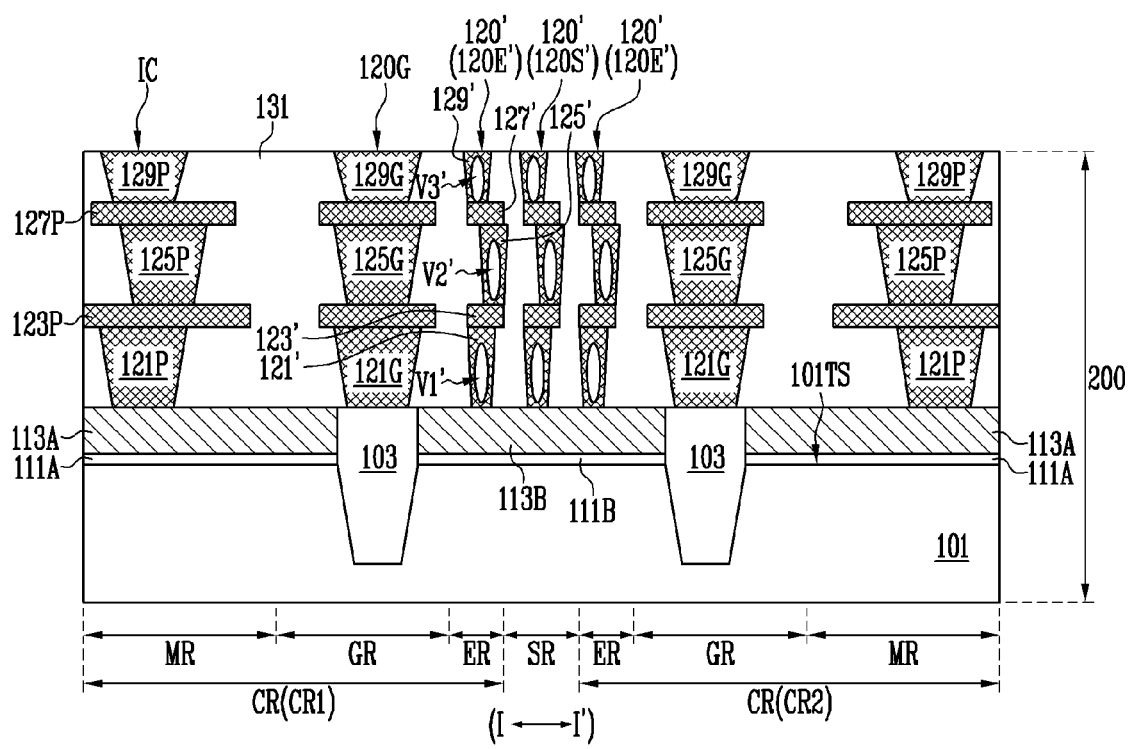
FIGS. 7B, 10B, 11B, and 12B are sectional views illustrating a manufacturing method of a semiconductor memory device in accordance with an embodiment of the present disclosure.

FIGS. 7A and 7B are sectional views illustrating a process of forming a peripheral circuit-side structure 200 of the semiconductor memory device.

Referring to FIGS. 7A and 7B, an isolation structure 103 may be formed in a semiconductor substrate 101. To this end, a trench may be formed by etching a portion of the semiconductor substrate 101. The trench may be filled with an insulating material. The isolation structure 103 may be formed in a chip guard region GR of the semiconductor substrate 101.

Subsequently, an insulating layer and a gate conductive layer may be stacked over the semiconductor substrate 101. Subsequently, the insulating layer and the gate conductive layer may be etched. Accordingly, the insulating layer and the gate conductive layer on the isolation structure 103 may be removed. The insulating layer may be isolated into a gate insulating layer 111A and a dummy gate insulating layer 111B, and the gate conductive layer may be isolated into a gate electrode 113A and a dummy gate electrode 113B.

The gate insulating layer 111A and the gate electrode 113A may be respectively formed at upper portions of a first chip region CR1 and a second chip region CR2. The dummy gate insulating layer 111B and the dummy gate electrode 113B may be disposed above a scribe region SR of the semiconductor substrate 101, and extend onto an edge region ER.

Subsequently, an interconnection IC, a lower chip guard structure 120G, and a plurality of lower void-containing structures 120 or 120' may be formed inside a first lower insulating structure 131.

The interconnection IC may overlap with a memory cell array region MR of the semiconductor substrate 101. The interconnection IC may include a plurality of conductive patterns 121P, 123P, 125P, 127P, and 129P stacked in a vertical direction substantially orthogonal to a top surface 101TS of the semiconductor substrate 101. Each of the plurality of conductive patterns 121P, 123P, 125P, 127P, and 129P may be formed through a damascene process.

The first lower insulating structure 131 may include a plurality of insulating layers disposed at the same levels as the plurality of conductive patterns 121P, 123P, 125P, 127P, and 129P.

The lower chip guard structure 120G may overlap with the chip guard region GR of the semiconductor substrate 101. In an embodiment, the lower chip guard structure 120G may be disposed above the isolation structure 103. The lower chip guard structure 120G may include a plurality of lower chip guard patterns 121G, 123G, 125G, 127G, and 129G stacked in the vertical direction.

The plurality of lower void-containing structures 120 or 120' may include a first lower void-containing structure 120E or 120E' overlapping with the edge region ER of the semiconductor substrate 101 and a second lower void-containing structure 120S or 120S' overlapping with the scribe region SR of the semiconductor substrate 101. Each lower void-containing structure 120 or 120' may include at least one lower void-containing pattern. In an embodiment, each lower void-containing structure 120 or 120' may include a plurality of lower void-containing patterns 121, 125, and 129 shown in FIG. 7A or 121, 125, and 129' shown in FIG. 7B, which are disposed to be spaced apart from each other in the vertical direction. Pad patterns 123 and 127 shown in FIG. 7A or 123' and 127' shown in FIG. 7B may be disposed between the plurality of lower void-containing patterns 121, 125, and 129 shown in FIG. 7A or 121, 125, and 129' shown in FIG. 7B, which are adjacent to each other in the vertical direction.

While the plurality of conductive patterns 121P, 123P, 125P, 127P, and 129P are formed, the plurality of lower chip guard patterns 121G, 123G, 125G, 127G, and 129G and the plurality of lower void-containing patterns 121, 125, and 129 shown in FIG. 7A or 121, 125, and 129' shown in FIG. 7B, and the pad patterns 123 and 127 shown in FIG. 7A or 123' and 127' shown in FIG. 7B may be formed.

The plurality of lower void-containing patterns 121, 125, and 129 shown in FIG. 7A or 121, 125, and 129' shown in FIG. 7B may be formed to have a width narrower than a width of the plurality of conductive patterns 121P, 125P, and 129P disposed at the same levels there as. The plurality of lower void-containing patterns 121, 125, and 129 shown in FIG. 7A or 121, 125, and 129' shown in FIG. 7B may be formed to have a width narrower than a width of the plurality of lower chip guard patterns 121G, 125G, and 129G disposed at the same levels there as. Accordingly, the plurality of lower void-containing patterns 121, 125, and 129 shown in FIG. 7A or 121, 125, and 129' shown in FIG. 7B may have an aspect ratio higher than aspect ratios of the plurality of conductive patterns 121P, 125P, and 129P and the plurality of lower chip guard patterns 121G, 125G, and 129G. While a damascene process is performed, a plurality of voids V1, V2, and V3 shown in FIG. 7A or V1', V2', and V3' shown in FIG. 7B may be respectively disposed inside the plurality of lower void-containing patterns 121, 125, and 129 shown in FIG. 7A or 121, 125, and 129' shown in FIG. 7B, which have a relatively high aspect ratio.

As shown in FIG. 7A, a plurality of lower void-containing patterns 121, 125, and 129 in accordance with an embodiment of the present disclosure may be aligned in a line in the vertical direction. Accordingly, a plurality of voids V1, V2, and V3 may be aligned in a line in the vertical direction.

As shown in FIG. 7B, a plurality of lower void-containing patterns 121', 125', and 129' in accordance with an embodiment of the present disclosure may be aligned in zigzag in the vertical direction. Accordingly, a plurality of voids V1', V2', and V3' may be aligned in zigzag in the vertical direction.

Figure 8A:
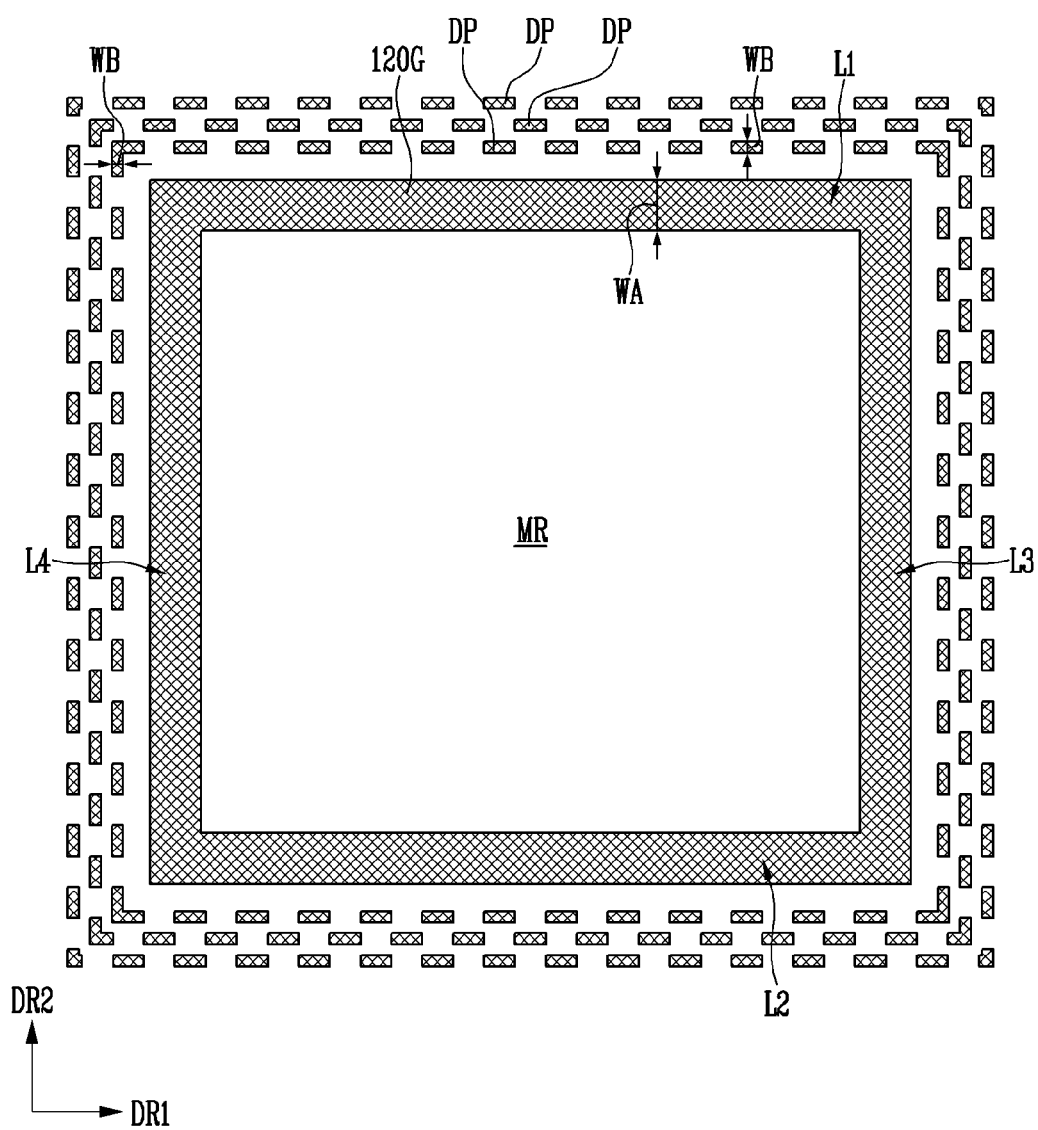
FIGS. 8A and 8B are plan views illustrating a pattern configured in a lower void-containing structure and a lower chip guard structure in accordance with embodiments of the present disclosure.
Figure 8B:
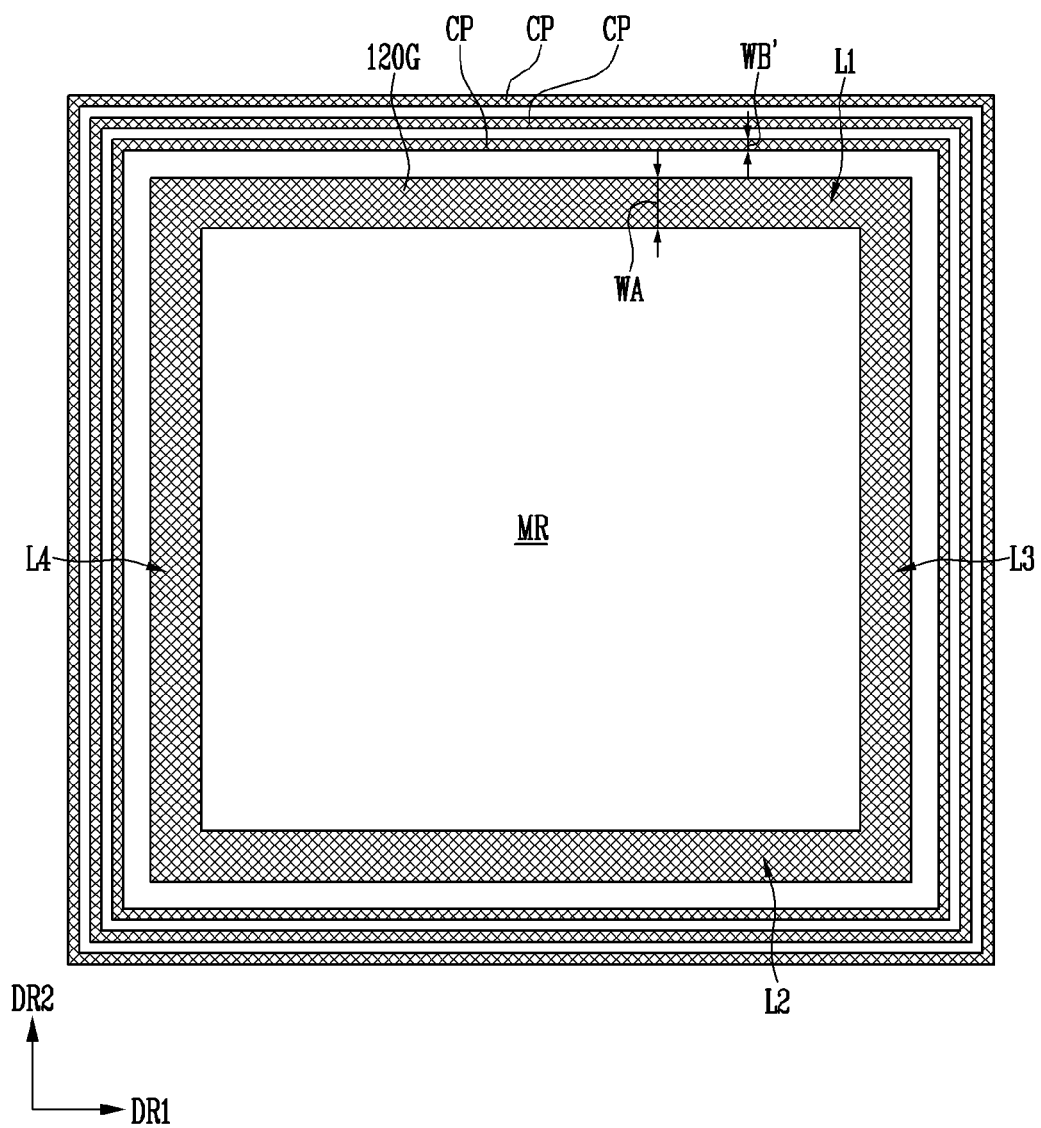

FIGS. 8A and 8B are plan views illustrating a pattern configured in a lower void-containing structure and a lower chip guard structure in accordance with embodiments of the present disclosure.

Referring to FIGS. 8A and 8B, a first direction DR1 and a second direction DR2 may be defined as directions in which axes intersecting each other face. The top surface 101TS of the semiconductor substrate 101 shown in FIGS. 7A and 7B may extend in the first direction DR1 and the second direction DR2.

The lower chip guard structure 120G may continuously extend to surround the memory cell array region MR on a plane substantially parallel to the top surface 101TS of the semiconductor substrate 101 shown in FIGS. 7A and 7B. In an embodiment, the lower chip guard structure 120G may include a first line part L1 and a second line part L2, which extend in the first direction DR1, and a third line part L3 and a fourth line part L4, which extend in the second direction DR2. The first line part L1 and the second line part L2 may be spaced apart from each other in the second direction DR2 with the memory cell array region MR interposed therebetween. The third line part L3 and the fourth line part L4 may be spaced apart from each other in the first direction DR1 with the memory cell array region MR interposed therebetween. The first line part L1 and the second line part L2 may be connected to each other by the third line part L3 and the fourth line part L4. Each of the plurality of lower chip patterns 121G, 123G, 125G, 127G, and 129G shown in FIGS. 7A and 7B may extend identically to the first line part L1, the second line part L2, the third line part L3, and the fourth line part L4.

Referring to FIG. 8A, a plurality of dotted patterns DP may be arranged to be spaced apart from each other along a region surrounding the lower chip guard structure 120G. The plurality of dotted patterns DP may be spaced apart from each other along at least one region among the scribe and edge regions SR and ER, which are shown in FIGS. 7A and 7B. The plurality of dotted patterns DP may be arranged to be spaced apart from each other in the first direction DR1 and the second direction DR2.

Each of the plurality of dotted patterns DP may include the lower void-containing structure 120 shown in FIG. 7A or the lower void-containing structure 120' shown in FIG. 7B. For example, each of the plurality of lower void-containing patterns 121, 125, and 129 shown in FIG. 7A may form a dotted pattern DP. A width WB of the dotted pattern DP may be formed smaller than a width WA of the lower chip guard structure 120G.

Referring to FIG. 8B, a closed shape pattern CP may be formed, which continuously extends along a region surrounding the lower chip guard structure 120G. The closed shape pattern CP may extend along at least one region among the scribe and edge regions SR and ER shown in FIGS. 7A and 7B, and extend in the first direction DR1 and the second direction DR2.

The closed shape pattern CP may include the lower void-containing structure 120 shown in FIG. 7A or the lower void-containing structure 120' shown in FIG. 7B. For example, each of the plurality of lower void-containing patterns 121, 125, and 129 shown in FIG. 7A may form a closed shape pattern CP. A width WB' of the closed shape pattern CP may be formed smaller than the width WA of the lower chip guard structure 120G.

Figure 9:
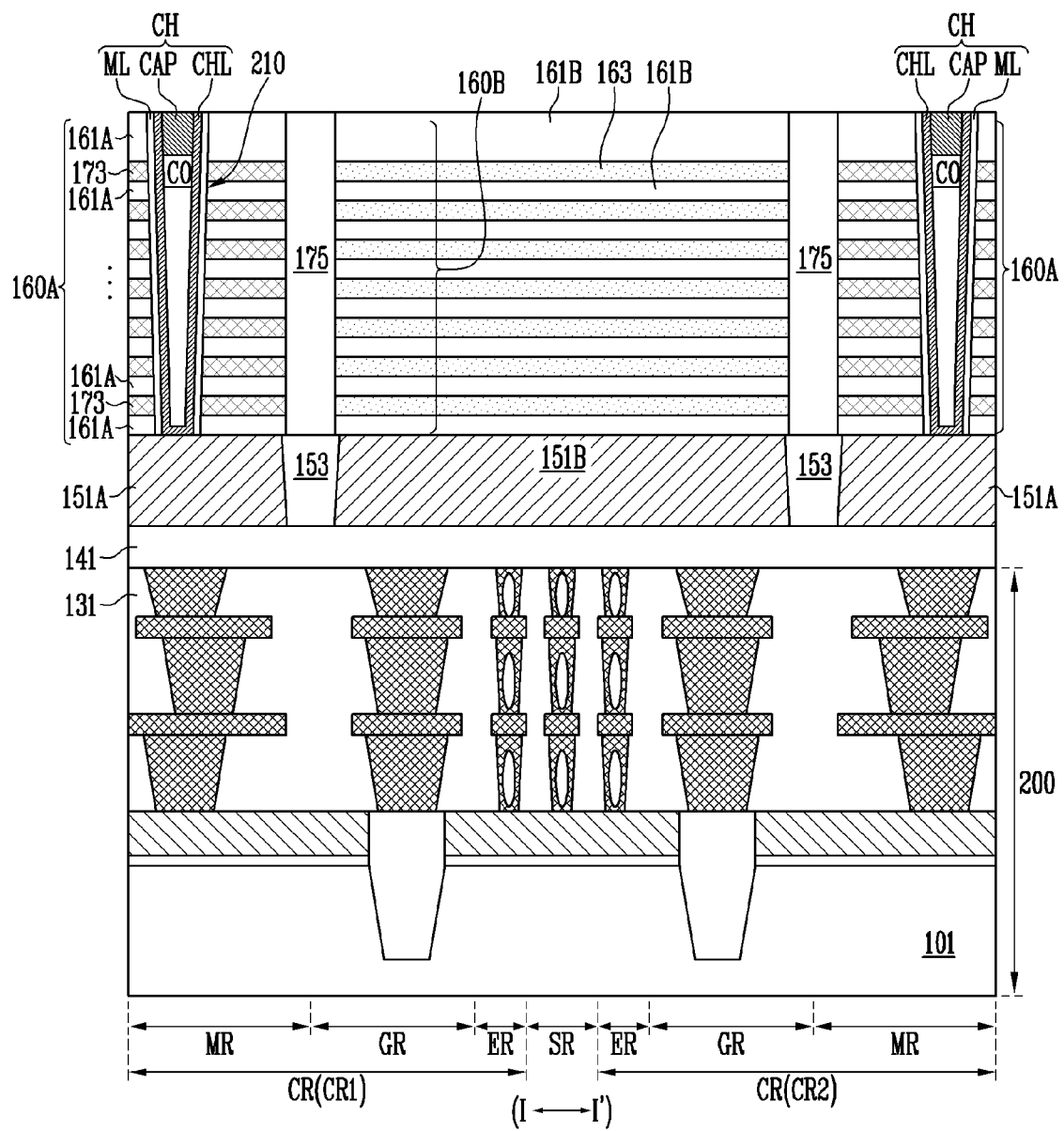

FIG. 9 is a sectional view illustrating a process of forming a multi-layer structure.

Referring to FIG. 9, before the multi-layer structure is formed, a second lower insulating structure 141 may be formed over the peripheral circuit-side structure 200 shown in FIGS. 7A and 7B.

Subsequently, a process of forming a source conductive layer over the second lower insulating structure 141 and a process of forming a first isolation insulating layer 153 penetrating the source conductive layer may be performed. The source conductive layer may be isolated into a source layer 151A over the memory cell array region MR and a dummy source layer 151B over the chip guard region GR by the first isolation insulating layer 153. The dummy source layer 151B may extend onto the edge region ER and the scribe region SR.

Subsequently, the multi-layer structure may be formed. The multi-layer structure may include a gate stack structure 160A disposed above the source layer 151A, a memory layer ML and a channel structure CH, which penetrate the gate stack structure 160A, and a dummy stack structure 160B disposed above the dummy source layer 151B.

The process of forming the multi-layer structure may include a process of forming a preliminary stack structure which is disposed above the dummy source layer 151B and extends onto the source layer 151. The preliminary stack structure may include a plurality of primary first material layers and a plurality of primary second material layers, which are alternately stacked in the vertical direction.

The process of forming the multi-layer structure may include a process of forming a channel hole 210 penetrating the preliminary stack structure and exposing the source layer 151A, a process of forming the memory layer ML on a sidewall of the channel hole 210, a process of forming a channel layer CHL which extends along a surface of the memory layer ML and a surface of the source layer 151A and is disposed inside the channel hole 210, and a process of forming a core insulating layer CO and a capping pattern CAP in a central region of the channel hole 210, which is opened by the channel layer CHL. Accordingly, the channel structure CH may be provided, which has a sidewall surrounded by the memory layer ML.

Subsequently, a second isolation insulating layer 175 may be formed. The second isolation insulating layer 175 may penetrate a portion of the preliminary stack structure overlapping with the first isolation insulating layer 153. Accordingly, the dummy stack structure 160B may be formed. The dummy stack structure 160B may be formed with a plurality of first material layers 161B as some of the plurality of primary first material layers and a plurality of second material layers 163 as some of the plurality of primary second material layers. The dummy stack structure 160B may be disposed above the dummy source layer 151B.

Other some of the plurality of primary first material layers over the source layer 151A may remain as a plurality of interlayer insulating layer 161A. When the plurality of primary second material layers are formed of a conductive material, other some of the plurality of primary second material layers over the source layer 151A may remain as a plurality of conductive patterns 173. When the plurality of primary second material layers are formed of a sacrificial material such as nitride, the other some of the plurality of primary second material layers over the source layer 151A may be replaced with the plurality of conductive patterns 173. The plurality of second material layers 163 on the dummy source layer 151B may be protected by the second isolation insulating layer 175.

As described above, through various processes, the gate stack structure 160A can be formed, which includes the plurality of interlayer insulating layers 161A and the plurality of conductive patterns 173, which are alternately stacked over the source layer 151A.

Figure 10A:
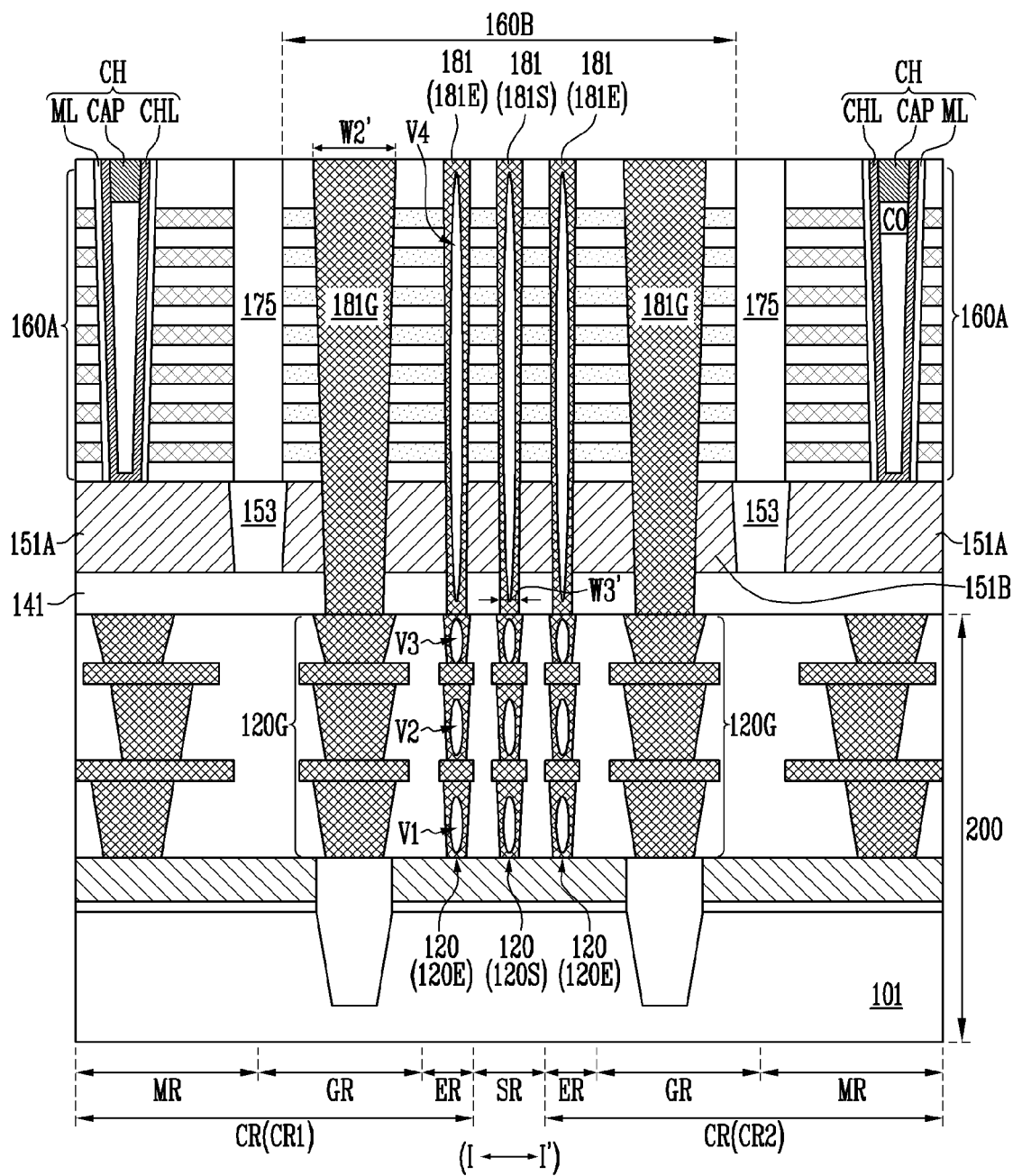
Figure 10B:
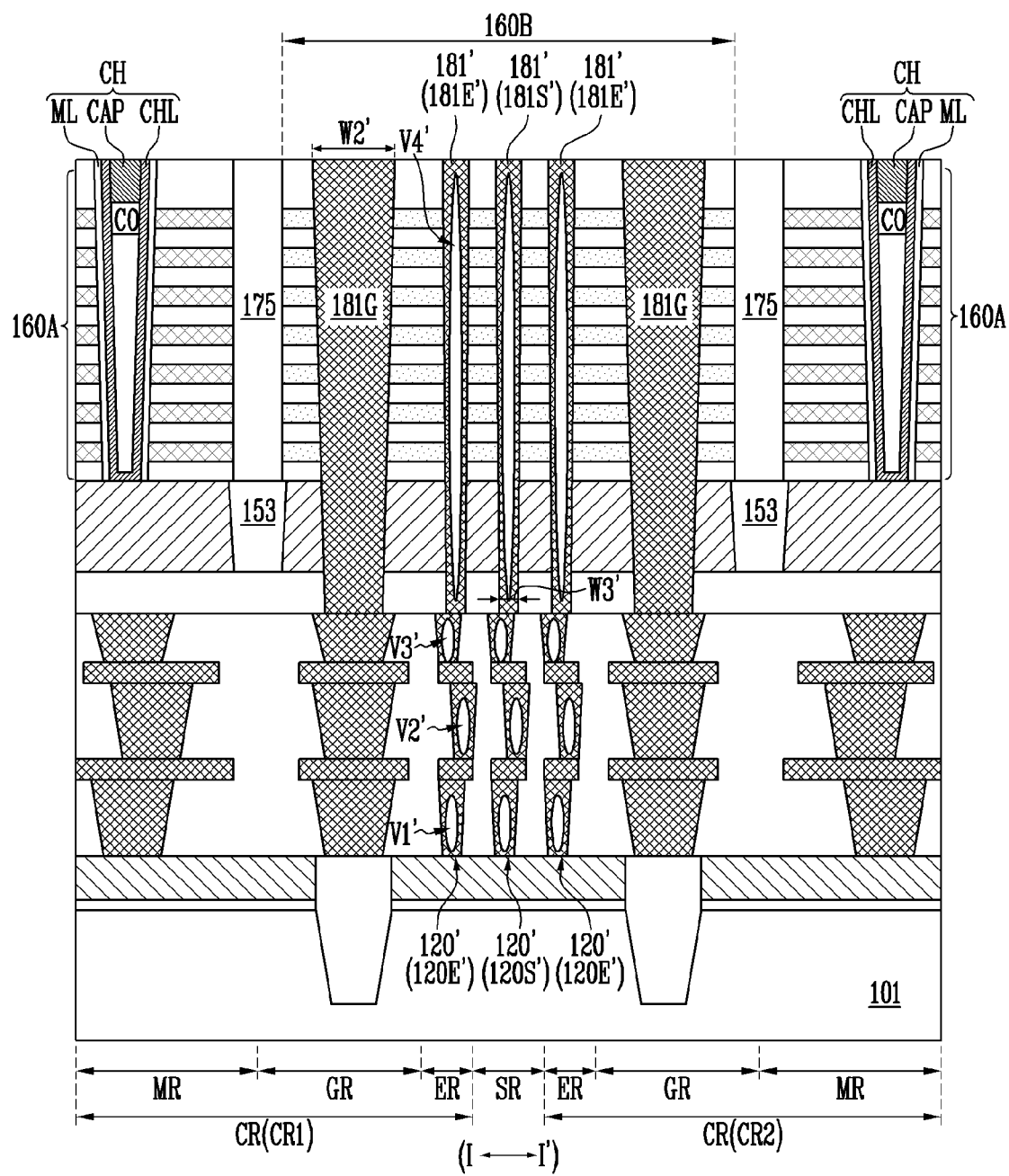

FIGS. 10A and 10B are sectional views illustrating a process of forming an intermediate chip guard pattern and an intermediate void-containing pattern.

Referring to FIGS. 10A and 10B, an intermediate chip guard pattern 181G and a plurality of intermediate void-containing patterns 181 or 181' may be formed, which penetrate the dummy stack structure 160B. The intermediate chip guard pattern 181G and the plurality of intermediate void-containing patterns 181 or 181' may be formed through a damascene process. Each of the intermediate chip guard pattern 181G and the plurality of intermediate void-containing patterns 181 or 181' may extend substantially in parallel to the channel structure CH, and penetrate the dummy source layer 151B and the second lower insulating structure 141.

The intermediate chip guard pattern 181G may penetrate a portion of the dummy stack structure 160B overlapping with the chip guard region GR of the semiconductor substrate 101. The intermediate chip guard pattern 181G may overlap with the lower chip guard structure 120G, and extend to be connected to the lower chip guard structure 120G.

The plurality of intermediate void-containing patterns 181 or 181' may be respectively connected to the plurality of lower void-containing structures 120 or 120'. The plurality of intermediate void-containing patterns 181 or 181' may include a first intermediate void-containing pattern 181E or 181E' and a second intermediate void-containing pattern 181S to 181S'. The first intermediate void-containing pattern 181E or 181E' may penetrate a portion of the dummy stack structure 160B overlapping with the edge region ER of the semiconductor substrate 101. The second intermediate void-containing pattern 181S to 181S' may penetrate a portion of the dummy stack structure 160B overlapping with the scribe region SR of the semiconductor substrate 101.

A width W3' of each of the plurality of intermediate void-containing patterns 181 or 181' may be formed smaller than a width W2' of the intermediate chip guard pattern 181G. Accordingly, each intermediate void-containing patterns 181 or 181' may have an aspect ratio higher than an aspect ratio of the intermediate chip guard pattern 181G. While the damascene process is performed, a void V4 or V4' may be disposed inside the intermediate void-containing patterns 181 or 181' having a relatively high aspect ratio.

As shown in FIG. 10A, an intermediate void-containing pattern 181 and the lower void-containing structure 120 in accordance with an embodiment of the present disclosure may be aligned in a line in the vertical direction. Accordingly, a plurality of voids V1, V2, and V3 of the lower void-containing structure 120 and a void V4 of the intermediate void-containing pattern 181 may be aligned in a line in the vertical direction.

As shown in FIG. 10B, an intermediate void-containing pattern 181' and the lower void-containing structure 120' in accordance with an embodiment of the present disclosure may be aligned in zigzag in the vertical direction. Accordingly, a plurality of voids V1', V2', and V3' of the lower void-containing structure 120' and a void V4' of the intermediate void-containing pattern 181' may be aligned in zigzag in the vertical direction.

In an embodiment, from a planar viewpoint, the intermediate void-containing pattern 181 or 181' shown in FIGS. 10A and 10B may form each of the plurality of dotted patterns DP shown in FIG. 8A. In another embodiment, from a planar viewpoint, the intermediate void-containing pattern 181 or 181' shown in FIGS. 10A and 10B may form the closed shape pattern CP shown in FIG. 8B.

Figure 11A:
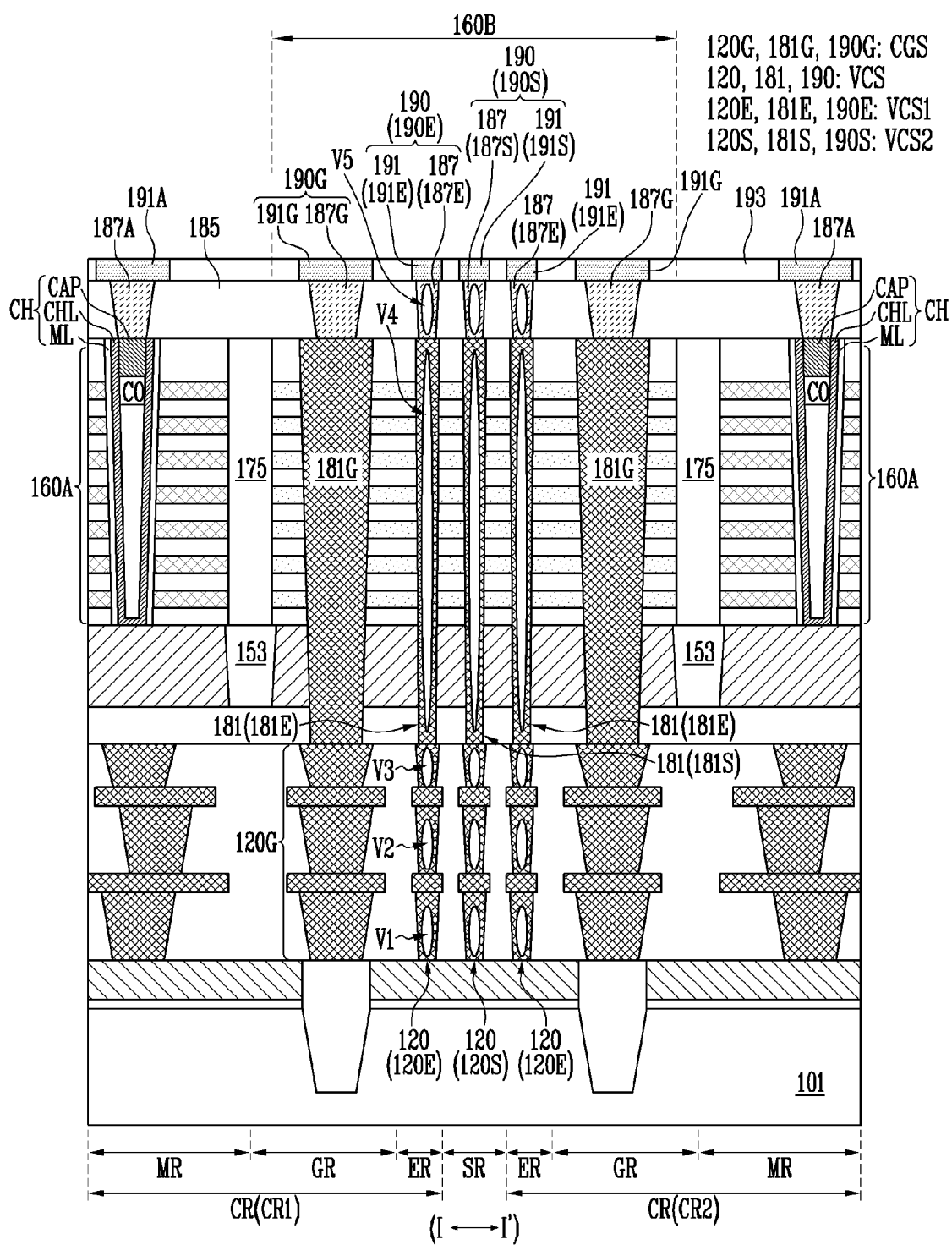
Figure 11B:
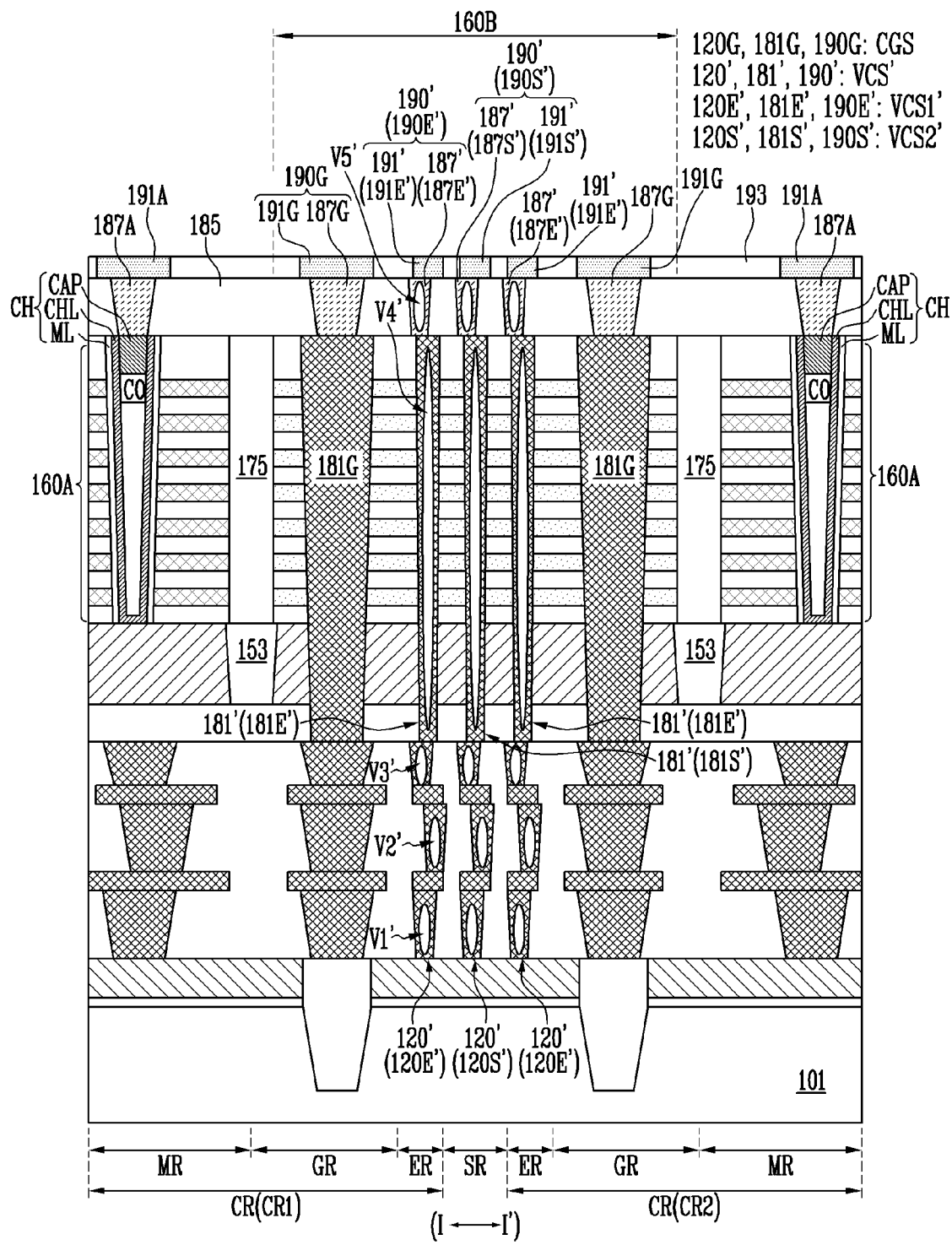

FIGS. 11A and 11B are sectional views illustrating a process of forming an upper chip guard structure and an upper void-containing structure.

Referring to FIGS. 11A and 11B, a first insulating layer 185 may be formed over the gate stack structure 160A and the dummy stack structure 160B. The first insulating layer 185 may extend to cover the channel structure CH, the second isolation insulating layer 175, the intermediate chip guard pattern 181G, and the intermediate void-containing pattern 181 or 181'.

Subsequently, a contact structure 187A, a first upper chip guard pattern 187G, and a plurality of upper void-containing patterns 187 or 187, which penetrate the first insulating layer 185, may be formed by using a damascene process. The contact structure 187A may be connected to the channel structure CH. The first upper chip guard pattern 187G may be connected to the intermediate chip guard pattern 181G. The plurality of upper void-containing patterns 187 or 187' may be respectively connected to the plurality of intermediate void-containing patterns 181 or 181'.

The plurality of upper void-containing patterns 187 or 187' may include a first upper void-containing pattern 187E or 187E' and a second upper void-containing pattern 187S or 187S'. The first upper void-containing pattern 187E or 187E' may penetrate a portion of the first insulating layer 185 overlapping with the edge region ER of the semiconductor substrate 101. The second upper void-containing pattern 187S or 187S' may penetrate a portion of the first insulating layer 185 overlapping with the scribe region SR of the semiconductor substrate 101.

Each of the plurality of upper void-containing patterns 187 or 187' may be formed to have a width narrower than a width of each of the first upper chip guard pattern 187G and the contact structure 187A. Accordingly, the upper void-containing pattern 187 or 187' may have an aspect ratio higher than an aspect ratio of each of the first upper chip guard pattern 187G and the contact structure 187A. While the damascene process is performed, a void V5 or V5' may be disposed inside the upper void-containing pattern 187 or 187' having a relatively high aspect ratio.

As shown in FIG. 11A, an upper void-containing pattern 187, an intermediate void-containing pattern 181, and a lower void-containing structure 120 in accordance with an embodiment of the present disclosure may be aligned in a line in the vertical direction. Accordingly, a plurality of voids V1, V2, and V3 of the lower void-containing structure 120, a void V4 of the intermediate void-containing pattern 181, and a void V5 of the upper void-containing pattern 187 may be aligned in a line in the vertical direction.

As shown in FIG. 11B, an upper void-containing pattern 187, an intermediate void-containing pattern 181, and a lower void-containing structure 120' in accordance with an embodiment of the present disclosure may be aligned in zigzag in the vertical direction. Accordingly, a plurality of voids V1', V2', and V3' of the lower void-containing structure 120, a void V4' of the intermediate void-containing pattern 181, and a void V5' of the upper void-containing pattern 187' may be aligned in zigzag in the vertical direction.

In an embodiment, from a planar viewpoint, the upper void-containing pattern 187 or 187' shown in FIGS. 11A and 11B may form each of the plurality of dotted patterns DP shown in FIG. 8A. In another embodiment, from a planar viewpoint, the upper void-containing pattern 187 or 187' shown in FIGS. 11A and 11B may form the closed shape pattern shown in FIG. 8A.

Referring to FIGS. 11A and 11B, a second insulating layer 193 may be formed over the first insulating layer 185. The second insulating layer 193 may extend to cover the contact structure 187A, the first upper chip guard pattern 187G, and the plurality of upper void-containing patterns 187 or 187'. Subsequently, a bit line 191A, a second upper chip guard pattern 191G, and a plurality of upper pad patterns 191 may be formed, which penetrate the second insulating layer 193. Accordingly, an upper chip guard structure 190G may be formed, which includes a first upper chip guard pattern 187G and a second upper chip guard pattern 191G, and a plurality of upper void-containing structures 190 or 190' may be formed, which include a plurality of upper void-containing patterns 187 or 187' and a plurality of upper pad patterns 191 or 191' overlapping therewith.

The bit line 191A may be in contact with the contact structure 187A. The second upper chip guard pattern 191G may overlap with the first upper chip guard pattern 187G. The upper pad pattern 191 or 191' may overlap with the upper void-containing pattern 187 or 187'.

The lower chip guard structure 120G, the intermediate chip guard pattern 181G, and the upper chip guard structure 190G, which are arranged in the vertical direction, may form a chip guard structure CGS.

The plurality of lower void-containing structures 120 or 120, the plurality of intermediate void-containing patterns 181 or 181, and the plurality of upper void-containing structures 190 or 190' may form a plurality of void-containing structures VCS or VCS'. The plurality of void-containing structures VCS or VCS' may include a first void-containing structure VCS1 or VCS1' and a second void-containing structure VCS2 or VCS2'. The first void-containing structure VCS1 or VCS1' may include a first lower void-containing structure 120E or 120E', a first intermediate void-containing pattern 181E or 181E', and a first upper void-containing structure 190E or 190E', which are stacked over the edge region ER of the semiconductor substrate 101. The second void-containing structure VCS2 or VCS2' may include a second lower void-containing structure 120S or 120S', a second intermediate void-containing pattern 181S or 181S', and a second upper void-containing structure 190S or 190S', which are stacked over the scribe region SR of the semiconductor substrate 101.

As shown in FIG. 11A, a plurality of voids V1, V2, V3, V4, and V5 of each void-containing structure VCS may be aligned in a line in the vertical direction to propagate a crack to the scribe region SR of the semiconductor substrate 101 in a subsequent process.

As shown in FIG. 11B, a plurality of voids V1', V2', V3', V4', and V5' of each void-containing structure VCS' may be aligned in zigzag in the vertical direction to propagate a crack to the scribe region SR of the semiconductor substrate 101.

While the semiconductor memory device is manufactured, an etching process may be performed on at least one void among the plurality of voids V1', V2', V3', V4', and V5'. In the embodiment in which the plurality of voids V1', V2', V3', V4', and V5' are aligned in zigzag, an etching material used for the etching process is introduced through a void, and thus a phenomenon in which a structure (e.g., the semiconductor substrate 101) under the void is damaged may be reduced.

Figure 12A:
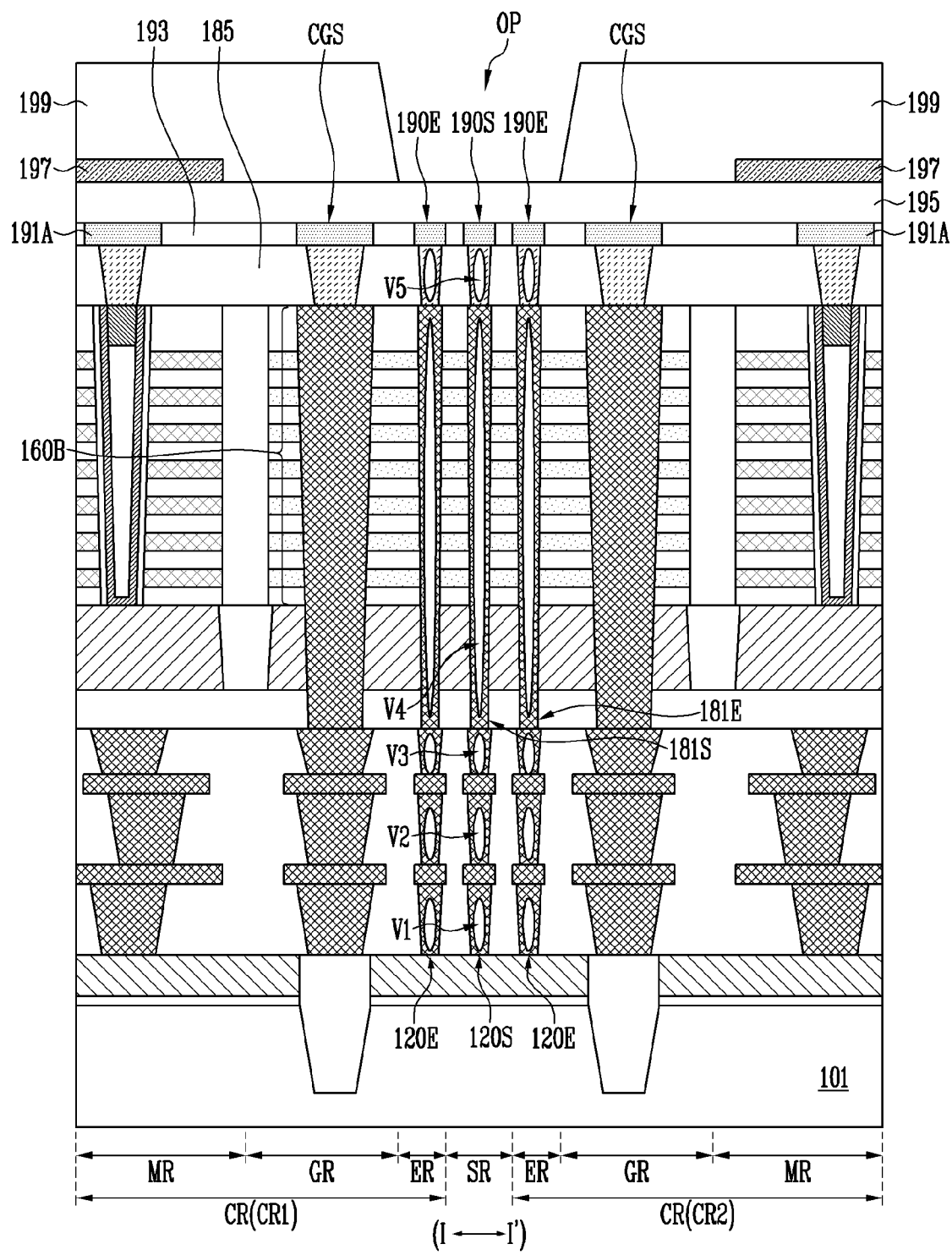
Figure 12B:
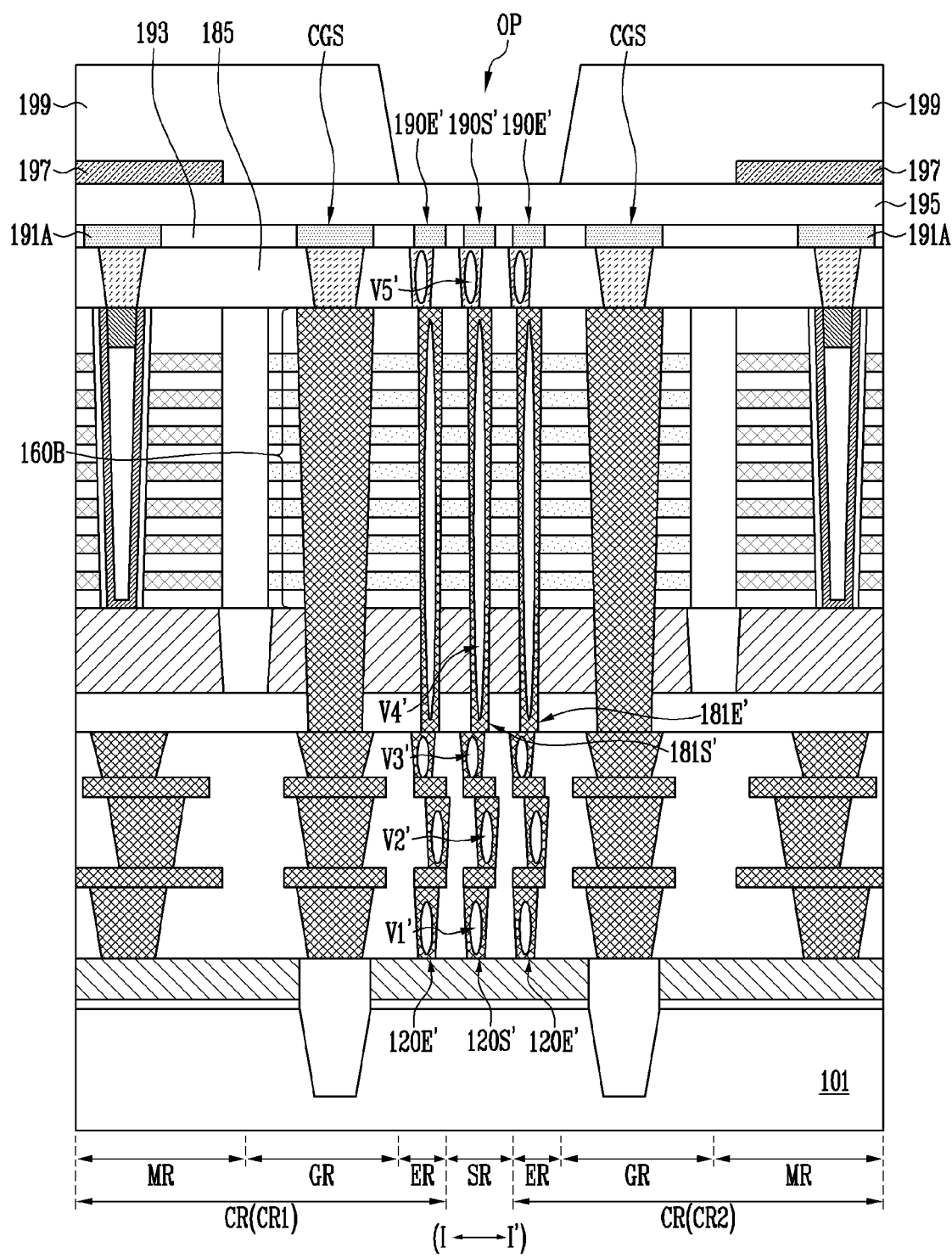

FIGS. 12A and 12B are sectional views illustrating a process of forming an upper structure.

Referring to FIGS. 12A and 12B, an upper insulating layer 195 may be formed over the second insulating layer 193. The upper insulating layer 195 may extend to cover the bit line 191A, the chip guard pattern CGS, the first upper void-containing structure 190E or 190E', and the second upper void-containing structure 190S or 190S'.

Subsequently, an upper line 197 may be formed over the upper insulating layer 195. Subsequently, a protective layer 199 may be formed over the upper insulating layer 195 to cover the upper line 197. The protective layer 199 may include polyimide. The protective layer 199 may include an opening OP overlapping with the scribed region SR of the semiconductor substrate 101. The opening OP may extend to overlap with the edge region ER of the semiconductor substrate 101.

Subsequently, a dicing process of cutting each of the semiconductor substrate 101 and the dummy stack structure 160B in units of chips may be performed. The dicing process may be performed by using a laser or a blade. In accordance with the embodiment of the present disclosure, a crack is induced through the plurality of voids V1 to V5 shown in FIG. 12A or V1' to V5' shown in FIG. 12B, which are arranged in the vertical direction, thereby isolating the semiconductor substrate 101 and the dummy stack structure 160B in units of chips.

The crack may propagate to the inside of the scribe region SR of the semiconductor substrate 101 along the second lower void-containing structure 120S or 120S, the second intermediate void-containing pattern 181S or 181S', and the second upper void-containing structure 190S or 190S', which are disposed above the scribed region SR of the semiconductor substrate 101. A portion of each of the second lower void-containing structure 120S or 120S', the second intermediate void-containing pattern 181S or 181S, and the second upper void-containing structure 190S or 190S' may remain as the dummy structure DS or DS' shown in FIGS. 3A and 3B. In addition, the first lower void-containing structure 120E or 120E', the first intermediate void-containing pattern 181E or 181E', and the first upper void-containing structure 190E or 190E' may remain as a void-containing structure as described with reference to FIGS. 3A and 3B.

The path through which the crack propagates is not limited to the above-described embodiment. For example, the crack may propagate to the inside of the edge region ER of the semiconductor substrate 101 along the first lower void-containing structure 120E or 120E', the first intermediate void-containing pattern 181E or 181E', and the first upper void-containing structure 190E or 190E', which are disposed above the edge region ER of the semiconductor substrate 101.

In an embodiment, the crack occurring during the dicing process may be blocked by the chip guard structure CGS. Accordingly, in an embodiment, propagation of a crack to the inside of a structure disposed above the memory cell array region MR of the semiconductor substrate 101 may be prevented or mitigated by the chip guard structure CGS. In an embodiment, the chip guard structure CGS may prevent or mitigate a contaminant from the outside of a chip from infiltrating into the structure disposed above the memory cell array region MR of the semiconductor substrate 101.

Figure 13:
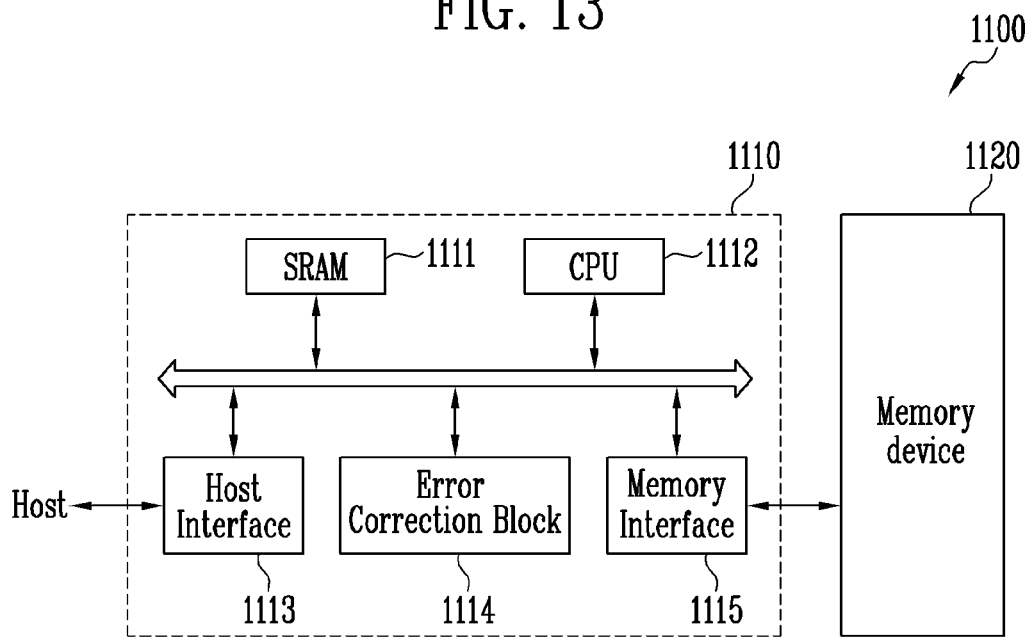
FIG. 13 is a block diagram illustrating a configuration of a memory system in accordance with an embodiment of the present disclosure.

FIG. 13 is a block diagram illustrating a configuration of a memory system in accordance with an embodiment of the present disclosure.

Referring to FIG. 13, the memory system 1100 includes a memory device 1120 and a memory controller 1110.

The memory device 1120 may include a memory cell array, a dummy stack structure, a chip guard structure penetrating the dummy stack structure, and a void-containing structure which penetrates the dummy stack structure and is formed to have a width narrower than a width of the chip guard structure. The memory device 1120 may be a multi-chip package configured with a plurality of flash memory chips.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

Figure 14:
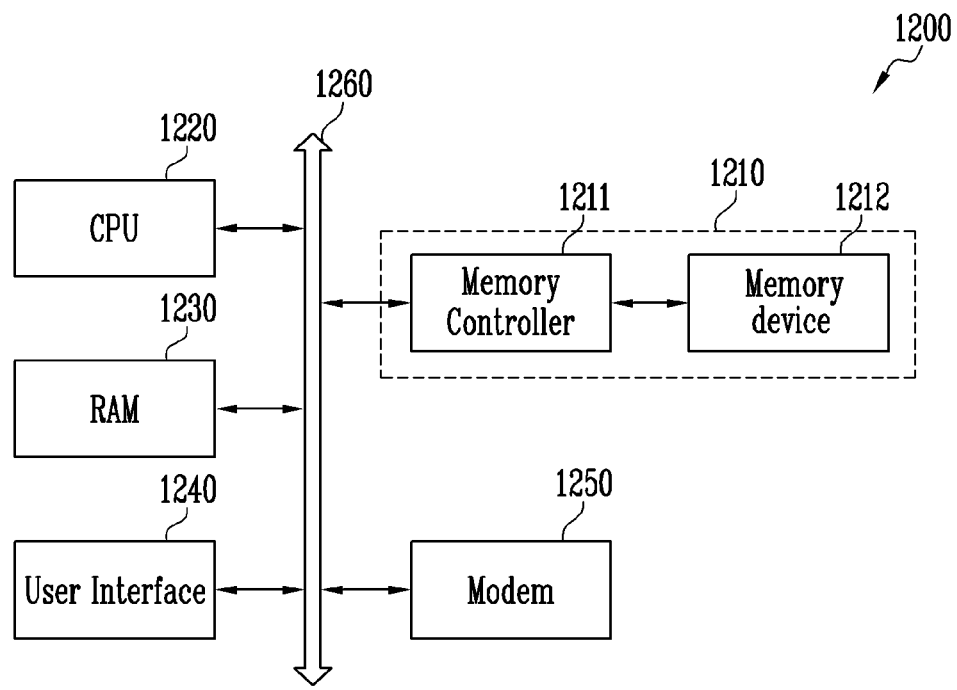
FIG. 14 is a block diagram illustrating a configuration of a computing system in accordance with an embodiment of the present disclosure.

FIG. 14 is a block diagram illustrating a configuration of a computing system in accordance with an embodiment of the present disclosure.

Referring to FIG. 14, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211. The memory device 1212 may include a memory cell array, a dummy stack structure, a chip guard structure penetrating the dummy stack structure, and a void-containing structure which penetrates the dummy stack structure and is formed to have a width narrower than a width of the chip guard structure. The memory controller 1211 may be configured to control the memory device 1212.

In accordance with an embodiment, a crack is induced inside a semiconductor substrate by using a void-containing structure, so that the stability of a process of cutting the semiconductor substrate in units of chips may be improved.

In accordance with an embodiment, a width of the void-containing structure is controlled to become narrower than a width of a chip guard structure, so that a void may be formed inside the void containing structure during a process of forming the chip guard structure.

What is claimed is:

1. A semiconductor memory device comprising:
   a semiconductor substrate including a first region and a second region;
   a memory cell array over the first region of the semiconductor substrate;
   a dummy stack structure over the second region of the semiconductor substrate;
   a chip guard structure penetrating the dummy stack structure; and
   a void-containing structure penetrating the dummy stack structure,
   wherein the dummy stack structure extends to surround opposite sidewalls of the void-containing structure.

2. The semiconductor memory device of claim 1, wherein the void-containing structure comprises a width narrower than a width of the chip guard structure.

3. The semiconductor memory device of claim 1, wherein the void-containing structure includes a plurality of void-containing patterns stacked in a vertical direction substantially orthogonal to a top surface of the semiconductor substrate, and
   wherein a plurality of voids are respectively disposed inside the plurality of void-containing patterns.

4. The semiconductor memory device of claim 3, wherein the voids of the plurality of void-containing patterns are aligned in a line in the vertical direction.

5. The semiconductor memory device of claim 3, wherein the voids of the plurality of void-containing patterns are aligned in zigzag in the vertical direction.

6. The semiconductor memory device of claim 1, wherein the void-containing structure is spaced apart from the memory cell array with the chip guard structure interposed between the void-containing structure and the memory cell array.

7. A semiconductor memory device comprising:
   a semiconductor substrate including a first region and a second region;
   a memory cell array over the first region of the semiconductor substrate;
   a dummy stack structure over the second region of the semiconductor substrate;
   a chip guard structure penetrating the dummy stack structure; and
   a void-containing structure penetrating the dummy stack structure,
   wherein the void-containing structure forms each of a plurality of dotted patterns spaced apart from each other along a region surrounding the chip guard structure on a plane substantially parallel to a top surface of the semiconductor substrate.

8. The semiconductor memory device of claim 1, wherein the void-containing structure forms a closed shape pattern continuously extending along a region surrounding the chip guard pattern on a plane substantially parallel to a top surface of the semiconductor substrate.

9. The semiconductor memory device of claim 1, further comprising:
   a peripheral circuit structure between the semiconductor substrate and the memory cell array; and an interconnection connected to the peripheral circuit structure.

10. The semiconductor memory device of claim 9, wherein the memory cell array includes:
a gate stack structure including a plurality of interlayer insulating layers and a plurality of conductive patterns, which are alternately stacked over the interconnection;
a channel structure penetrating the gate stack structure;
a memory layer between the channel structure and the gate stack structure;
a contact structure on the channel structure; and
a bit line connected to the channel structure via the contact structure.

11. The semiconductor memory device of claim 10, wherein the plurality of void-containing structures include at least one of:
a lower void-containing pattern disposed at the substantially same level as the interconnection;
an intermediate void-containing pattern overlapping with the lower void-containing pattern, the intermediate void-containing pattern extending substantially in parallel to the channel structure; and
an upper void-containing pattern overlapping with the intermediate void-containing pattern, the upper void-containing pattern being disposed at the substantially same level as the contact structure.

12. A semiconductor memory device comprising:
a semiconductor substrate including a memory cell array region, a scribe region, and a chip guard region between the memory cell array region and the scribe region;
a gate stack structure including a plurality of interlayer insulating layers and a plurality of conductive patterns, which are alternately stacked over the semiconductor substrate in the memory cell array region;
a channel structure penetrating the gate stack structure;
a memory layer between the channel structure and the gate stack structure;
a dummy stack structure including a plurality of first material layers and a plurality of second material layers, which are alternately stacked over the semiconductor substrate in the chip guard region and extend to overlap with the scribe region;
a chip guard pattern penetrating a portion of the dummy stack structure overlapping with the chip guard region; and
a void-containing pattern penetrating a portion of the dummy stack structure overlapping with the scribe region,
wherein the dummy stack structure extends to surround opposite sidewalls of the void-containing pattern.

13. The semiconductor memory device of claim 12, wherein the void-containing pattern comprises a width narrower than a width of the chip guard pattern.

14. A semiconductor memory device comprising:
a semiconductor substrate including a memory cell array region, a scribe region, and a chip guard region between the memory cell array region and the scribe region;
a gate stack structure including a plurality of interlayer insulating layers and a plurality of conductive patterns, which are alternately stacked over the semiconductor substrate in the memory cell array region;
a channel structure penetrating the gate stack structure;
a memory layer between the channel structure and the gate stack structure;
a dummy stack structure including a plurality of first material layers and a plurality of second material layers, which are alternately stacked over the semiconductor substrate in the chip guard region and extend to overlap with the scribe region;
a chip guard pattern penetrating a portion of the dummy stack structure overlapping with the chip guard region; and
a void-containing pattern penetrating a portion of the dummy stack structure overlapping with the scribe region,
wherein the void-containing structure forms each of a plurality of dotted patterns spaced apart from each other along a region surrounding the chip guard pattern on a plane substantially parallel to a top surface of the semiconductor substrate.

15. The semiconductor memory device of claim 12, wherein the void-containing structure forms a closed shape pattern continuously extending along a region surrounding the chip guard pattern on a plane substantially parallel to a top surface of the semiconductor substrate.

16. The semiconductor memory device of claim 12, further comprising:
a peripheral circuit structure between the gate stack structure and the semiconductor substrate;
an interconnection connected to the peripheral circuit structure; and
a lower void-containing pattern between the dummy stack structure and the void-containing pattern, the lower void-containing pattern having a width narrower than a width of the interconnection.

17. The semiconductor memory device of claim 12, further comprising:
a bit line over the gate stack structure;
a contact structure between the bit line and the gate stack structure, the contact structure connecting the bit line and the channel structure to each other; and
an upper void-containing pattern over the void-containing pattern, the upper void-containing pattern having a width narrower than a width of the contact structure.

* * * * *